(12) United States Patent
Abel et al.

(10) Patent No.: US 10,269,559 B2
(45) Date of Patent: Apr. 23, 2019

(54) DIELECTRIC GAPFILL OF HIGH ASPECT RATIO FEATURES UTILIZING A SACRIFICIAL ETCH CAP LAYER

(71) Applicant: Lam Research Corporation, Fremont, CA (US)

(72) Inventors: Joseph Abel, West Linn, OR (US); Pulkit Agarwal, Beaverton, OR (US); Richard Phillips, Tualatin, OR (US); Purushottam Kumar, Hillsboro, OR (US); Adrien LaVoie, Newberg, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/703,917

(22) Filed: Sep. 13, 2017

(65) Prior Publication Data

US 2019/0080903 A1    Mar. 14, 2019

(51) Int. Cl.
*H01L 21/02* (2006.01)
*H01L 21/311* (2006.01)
*H01L 21/3105* (2006.01)

(52) U.S. Cl.
CPC .... *H01L 21/02164* (2013.01); *H01L 21/0228* (2013.01); *H01L 21/02274* (2013.01); *H01L 21/31055* (2013.01); *H01L 21/31116* (2013.01)

(58) Field of Classification Search
CPC ......... H01L 21/02164; H01L 21/61116; H01L 21/0228; H01L 21/02274; H01L 21/31055
See application file for complete search history.

(56) References Cited

U.S. PATENT DOCUMENTS

| 4,158,717 A | 6/1979 | Nelson |
| 4,500,563 A | 2/1985 | Ellenberger et al. |

(Continued)

FOREIGN PATENT DOCUMENTS

| CN | 1732288 A | 2/2006 |
| CN | 1841676 A | 10/2006 |

(Continued)

OTHER PUBLICATIONS

U.S. Notice of Allowance dated Aug. 18, 2015 issued in U.S. Appl. No. 14/494,914.

(Continued)

*Primary Examiner* — Anita K Alanko
(74) *Attorney, Agent, or Firm* — Weaver Austin Villeneuve & Sampson LLP

(57) ABSTRACT

Methods and apparatuses for depositing material into high aspect ratio features, features in a multi-laminate stack, features having positively sloped sidewalls, features having negatively sloped sidewalls, features having a re-entrant profile, and/or features having sidewall topography are described herein. Methods involve depositing a first amount of material, such as a dielectric (e.g., silicon oxide), into a feature and forming a sacrificial helmet on the field surface of the substrate, etching some of the first amount of the material to open the feature opening and/or smoothen sidewalls of the feature, and depositing a second amount of material to fill the feature. The sacrificial helmet may be the same as or different material from the first amount of material deposited into the feature.

20 Claims, 14 Drawing Sheets

(56) References Cited

U.S. PATENT DOCUMENTS

| | | | |
|---|---|---|---|
| 4,575,921 | A | 3/1986 | Bhagat |
| 4,869,781 | A | 9/1989 | Euen et al. |
| 5,091,332 | A | 2/1992 | Bohr et al. |
| 5,094,984 | A | 3/1992 | Liu et al. |
| 5,223,443 | A | 6/1993 | Chinn et al. |
| 5,230,929 | A | 7/1993 | Caporiccio et al. |
| 5,314,724 | A | 5/1994 | Tsukune et al. |
| 5,318,928 | A | 6/1994 | Gegenwart et al. |
| 5,459,099 | A | 10/1995 | Hsu |
| 5,496,608 | A | 3/1996 | Matsuda et al. |
| 5,528,719 | A | 6/1996 | Yamada |
| 5,593,914 | A | 1/1997 | Evans, Jr. et al. |
| 5,670,432 | A | 9/1997 | Tsai |
| 5,731,235 | A | 3/1998 | Srinivasan et al. |
| 5,854,105 | A | 12/1998 | Tseng |
| 5,856,003 | A | 1/1999 | Chiu |
| 5,874,368 | A | 2/1999 | Laxman et al. |
| 5,891,805 | A | 4/1999 | Cheng et al. |
| 5,916,365 | A | 6/1999 | Sherman |
| 5,932,286 | A | 8/1999 | Beinglass et al. |
| 5,976,990 | A | 11/1999 | Mercaldi et al. |
| 6,039,834 | A | 3/2000 | Tanaka et al. |
| 6,069,058 | A | 5/2000 | Hong |
| 6,100,202 | A | 8/2000 | Lin et al. |
| 6,153,519 | A | 11/2000 | Jain et al. |
| 6,197,701 | B1 | 3/2001 | Shue et al. |
| 6,218,293 | B1 | 4/2001 | Kraus et al. |
| 6,225,175 | B1 | 5/2001 | Houston |
| 6,228,779 | B1 | 5/2001 | Bloom et al. |
| 6,270,572 | B1 | 8/2001 | Kim et al. |
| 6,326,322 | B1 | 12/2001 | Kim et al. |
| 6,346,741 | B1 | 2/2002 | Van Buskirk et al. |
| 6,380,056 | B1 | 4/2002 | Shue et al. |
| 6,391,803 | B1 | 5/2002 | Kim et al. |
| 6,395,652 | B2 | 5/2002 | Kim et al. |
| 6,403,416 | B1 | 6/2002 | Huang et al. |
| 6,416,822 | B1 | 7/2002 | Chiang et al. |
| 6,428,859 | B1 | 8/2002 | Chiang et al. |
| 6,468,924 | B2 | 10/2002 | Lee et al. |
| 6,482,726 | B1 | 11/2002 | Aminpur et al. |
| 6,509,601 | B1 | 1/2003 | Lee et al. |
| 6,518,167 | B1 | 2/2003 | You et al. |
| 6,528,430 | B2 | 3/2003 | Kwan et al. |
| 6,534,395 | B2 | 3/2003 | Werkhoven et al. |
| 6,548,368 | B1 | 4/2003 | Narwankar et al. |
| 6,551,893 | B1 | 4/2003 | Zheng et al. |
| 6,569,501 | B2 | 5/2003 | Chiang et al. |
| 6,576,053 | B1 | 6/2003 | Kim et al. |
| 6,602,784 | B2 | 8/2003 | Sneh |
| 6,632,478 | B2 | 10/2003 | Gaillard et al. |
| 6,632,741 | B1 | 10/2003 | Clevenger et al. |
| 6,638,879 | B2 | 10/2003 | Hsieh et al. |
| 6,645,574 | B1 | 11/2003 | Lee et al. |
| 6,689,220 | B1 | 2/2004 | Nguyen |
| 6,709,928 | B1 | 3/2004 | Jenne et al. |
| 6,723,595 | B2 | 4/2004 | Park |
| 6,730,614 | B1 | 5/2004 | Lim et al. |
| 6,743,738 | B2 | 6/2004 | Todd |
| 6,756,318 | B2 | 6/2004 | Nguyen et al. |
| 6,765,303 | B1 | 7/2004 | Krivokapic et al. |
| 6,794,284 | B2 | 9/2004 | Vaartstra |
| 6,809,421 | B1 | 10/2004 | Hayasaka et al. |
| 6,828,218 | B2 | 12/2004 | Kim et al. |
| 6,835,417 | B2 | 12/2004 | Saenger et al. |
| 6,861,356 | B2 | 3/2005 | Matsuse et al. |
| 6,884,466 | B2 | 4/2005 | Kaloyeros et al. |
| 6,926,798 | B2 | 8/2005 | Biberger et al. |
| 6,930,058 | B2 | 8/2005 | Hill et al. |
| 6,930,060 | B2 | 8/2005 | Chou et al. |
| 6,933,245 | B2 | 8/2005 | Lee et al. |
| 6,943,092 | B2 | 9/2005 | Kim et al. |
| 6,962,876 | B2 | 11/2005 | Ahn et al. |
| 6,967,159 | B2 | 11/2005 | Vaartstra |
| 6,987,240 | B2 | 1/2006 | Jennings et al. |
| 7,001,844 | B2 | 2/2006 | Chakravarti et al. |
| 7,019,159 | B2 | 3/2006 | Dussarrat et al. |
| 7,041,335 | B2 | 5/2006 | Chung |
| 7,077,904 | B2 | 7/2006 | Cho et al. |
| 7,081,271 | B2 | 7/2006 | Chung et al. |
| 7,097,886 | B2 | 8/2006 | Moghadam et al. |
| 7,109,129 | B1 | 9/2006 | Papasouliotis |
| 7,115,166 | B2 | 10/2006 | Vaartstra et al. |
| 7,115,528 | B2 | 10/2006 | Vaartstra et al. |
| 7,122,222 | B2 | 10/2006 | Xiao et al. |
| 7,122,464 | B2 | 10/2006 | Vaarstra |
| 7,125,815 | B2 | 10/2006 | Vaartstra |
| 7,132,353 | B1 | 11/2006 | Xia et al. |
| 7,141,278 | B2 | 11/2006 | Koh et al. |
| 7,148,155 | B1 | 12/2006 | Tarafdar et al. |
| 7,151,039 | B2 | 12/2006 | Lee et al. |
| 7,172,792 | B2 | 2/2007 | Wang et al. |
| 7,176,084 | B2 | 2/2007 | Lee et al. |
| 7,205,187 | B2 | 4/2007 | Leith et al. |
| 7,223,649 | B2 | 5/2007 | Oh et al. |
| 7,235,484 | B2 | 6/2007 | Nguyen et al. |
| 7,241,686 | B2 | 7/2007 | Marcadal et al. |
| 7,244,668 | B2 | 7/2007 | Kim |
| 7,250,083 | B2 | 7/2007 | Sneh |
| 7,259,050 | B2 | 8/2007 | Chen et al. |
| 7,261,919 | B2 | 8/2007 | Mehregany et al. |
| 7,294,582 | B2 | 11/2007 | Haverkort et al. |
| 7,297,641 | B2 | 11/2007 | Todd et al. |
| 7,300,885 | B2 | 11/2007 | Hasebe et al. |
| 7,301,210 | B2 | 11/2007 | Abadeer et al. |
| 7,314,835 | B2 | 1/2008 | Ishizaka et al. |
| 7,341,959 | B2 | 3/2008 | Brcka |
| 7,351,668 | B2 | 4/2008 | Chou et al. |
| 7,361,538 | B2 | 4/2008 | Luan et al. |
| 7,361,611 | B2 | 4/2008 | Chakravarti et al. |
| 7,390,743 | B2 | 6/2008 | Shin |
| 7,393,561 | B2 | 7/2008 | Paranjpe |
| 7,399,388 | B2 | 7/2008 | Moghadam et al. |
| 7,419,888 | B2 | 9/2008 | Yang et al. |
| 7,435,454 | B2 | 10/2008 | Brcka |
| 7,435,684 | B1 | 10/2008 | Lang et al. |
| 7,462,571 | B2 | 12/2008 | Hasebe et al. |
| 7,465,669 | B2 | 12/2008 | Iyer et al. |
| 7,482,247 | B1 * | 1/2009 | Papasouliotis ........ C23C 16/045 257/E21.245 |
| 7,488,694 | B2 | 2/2009 | Kim et al. |
| 7,507,676 | B2 | 3/2009 | Chou et al. |
| 7,510,984 | B2 | 3/2009 | Saito et al. |
| 7,514,366 | B2 | 4/2009 | Trivedi et al. |
| 7,521,331 | B2 | 4/2009 | Park et al. |
| 7,524,762 | B2 | 4/2009 | Marcadal et al. |
| 7,544,615 | B2 | 6/2009 | Vaartstra |
| 7,572,052 | B2 | 8/2009 | Ravi et al. |
| 7,592,231 | B2 | 9/2009 | Cheng et al. |
| 7,595,010 | B2 | 9/2009 | Chakravarti et al. |
| 7,601,648 | B2 | 10/2009 | Chua et al. |
| 7,611,980 | B2 | 11/2009 | Wells et al. |
| 7,615,438 | B2 | 11/2009 | Ahn et al. |
| 7,615,449 | B2 | 11/2009 | Chung et al. |
| 7,622,369 | B1 | 11/2009 | Lee et al. |
| 7,622,383 | B2 | 11/2009 | Kim et al. |
| 7,629,267 | B2 | 12/2009 | Wan et al. |
| 7,632,757 | B2 | 12/2009 | Matsuura |
| 7,633,125 | B2 | 12/2009 | Lu et al. |
| 7,638,170 | B2 | 12/2009 | Li |
| 7,645,484 | B2 | 1/2010 | Ishizaka |
| 7,651,729 | B2 | 1/2010 | Kim et al. |
| 7,651,730 | B2 | 1/2010 | Hasebe |
| 7,651,953 | B2 | 1/2010 | Todd et al. |
| 7,651,959 | B2 | 1/2010 | Fukazawa et al. |
| 7,682,657 | B2 | 3/2010 | Sherman |
| 7,687,409 | B2 | 3/2010 | Ahn et al. |
| 7,713,592 | B2 | 5/2010 | Nguyen et al. |
| 7,732,343 | B2 | 6/2010 | Niroomand et al. |
| 7,745,346 | B2 | 6/2010 | Hausmann et al. |
| 7,758,920 | B2 | 7/2010 | Hasebe et al. |
| 7,776,733 | B2 | 8/2010 | Hasegawa |
| 7,790,633 | B1 | 9/2010 | Tarafdar et al. |
| 7,807,578 | B2 | 10/2010 | Bencher et al. |
| 7,825,039 | B2 | 11/2010 | Takahashi et al. |

(56) References Cited

U.S. PATENT DOCUMENTS

| | | |
|---|---|---|
| 7,863,190 B1 | 1/2011 | Papasouliotis et al. |
| 7,906,168 B2 | 3/2011 | Hasebe et al. |
| 7,910,288 B2 | 3/2011 | Abatchev et al. |
| 7,910,497 B2 | 3/2011 | Olsen et al. |
| 7,919,416 B2 | 4/2011 | Lee et al. |
| 7,923,068 B2 | 4/2011 | Dickey et al. |
| 7,923,378 B2 | 4/2011 | Hasebe et al. |
| 7,939,455 B2 | 5/2011 | Clark |
| 7,959,985 B2 | 6/2011 | Ishizaka et al. |
| 7,964,241 B2 | 6/2011 | Hasebe et al. |
| 7,964,513 B2 | 6/2011 | Todd et al. |
| 7,972,980 B2 | 7/2011 | Lee et al. |
| 7,981,473 B2 | 7/2011 | Kim et al. |
| 7,989,365 B2 | 8/2011 | Park et al. |
| 8,034,673 B2 | 10/2011 | Kadonaga et al. |
| 8,080,290 B2 | 12/2011 | Hasebe et al. |
| 8,084,088 B2 | 12/2011 | Huy et al. |
| 8,101,531 B1 | 1/2012 | Li et al. |
| 8,105,901 B2 | 1/2012 | Cheng et al. |
| 8,119,424 B2 | 2/2012 | Mather et al. |
| 8,119,544 B2 | 2/2012 | Hasebe et al. |
| 8,133,797 B2 | 3/2012 | van Schravendijk et al. |
| 8,178,448 B2 | 5/2012 | Nodera et al. |
| 8,227,032 B2 | 7/2012 | Dussarrat et al. |
| 8,257,789 B2 | 9/2012 | Matsunaga et al. |
| 8,278,224 B1 | 10/2012 | Mui et al. |
| 8,298,628 B2 | 10/2012 | Yang et al. |
| 8,298,954 B1 | 10/2012 | Arnold et al. |
| 8,334,218 B2 | 12/2012 | Van Nooten et al. |
| 8,357,619 B2 | 1/2013 | Hasebe et al. |
| 8,366,953 B2 | 2/2013 | Kohno et al. |
| 8,383,525 B2 | 2/2013 | Raisanen et al. |
| 8,394,466 B2 | 3/2013 | Hong et al. |
| 8,524,612 B2 | 9/2013 | Li et al. |
| 8,592,328 B2 | 11/2013 | Hausmann et al. |
| 8,623,770 B1 | 1/2014 | Gao et al. |
| 8,633,050 B2 | 1/2014 | Pierreux |
| 8,637,411 B2 | 1/2014 | Swaminathan et al. |
| 8,647,993 B2 | 2/2014 | Lavoie et al. |
| 8,669,185 B2 | 3/2014 | Onizawa et al. |
| 8,703,578 B2 | 4/2014 | Hoentschel et al. |
| 8,728,955 B2 | 5/2014 | LaVoie et al. |
| 8,728,956 B2 | 5/2014 | LaVoie et al. |
| 8,753,984 B2 | 6/2014 | Murakami et al. |
| 8,791,034 B2 | 7/2014 | Shealy et al. |
| 8,846,484 B2 | 9/2014 | Lee et al. |
| 8,936,977 B2 | 1/2015 | Hoentschel et al. |
| 8,956,983 B2 | 2/2015 | Swaminathan et al. |
| 8,975,704 B2 | 3/2015 | Hoentschel et al. |
| 8,999,859 B2 | 4/2015 | Swaminathan et al. |
| 9,023,693 B1 | 5/2015 | Lin et al. |
| 9,023,737 B2 | 5/2015 | Beynet et al. |
| 9,070,555 B2 | 6/2015 | Hausmann et al. |
| 9,076,646 B2 | 7/2015 | Sims et al. |
| 9,095,869 B2 | 8/2015 | Kilpi et al. |
| 9,214,333 B1 | 12/2015 | Sims et al. |
| 9,214,334 B2 | 12/2015 | Swaminathan et al. |
| 9,230,800 B2 | 1/2016 | Lavoie et al. |
| 9,257,274 B2 | 2/2016 | Kang et al. |
| 9,287,113 B2 | 3/2016 | Kang et al. |
| 9,355,839 B2 | 5/2016 | Swaminathan et al. |
| 9,355,886 B2 | 5/2016 | Swaminathan et al. |
| 9,373,500 B2 | 6/2016 | Swaminathan et al. |
| 9,390,909 B2 | 7/2016 | Pasquale et al. |
| 9,406,693 B1 * | 8/2016 | Pang ............... H01L 27/11582 |
| 9,443,731 B1 | 9/2016 | O'Meara et al. |
| 9,472,506 B2 | 10/2016 | Conklin et al. |
| 9,502,238 B2 | 11/2016 | Danek et al. |
| 9,508,604 B1 | 11/2016 | Sung et al. |
| 9,530,663 B1 | 12/2016 | Shih et al. |
| 9,564,312 B2 | 2/2017 | Henri et al. |
| 9,570,274 B2 | 2/2017 | Swaminathan et al. |
| 9,570,290 B2 | 2/2017 | Swaminathan et al. |
| 9,576,817 B1 | 2/2017 | Cheng et al. |
| 9,589,790 B2 | 3/2017 | Henri et al. |
| 9,601,693 B1 | 3/2017 | Henri et al. |
| 9,611,544 B2 | 4/2017 | Lavoie et al. |
| 9,670,579 B2 | 6/2017 | Hausmann et al. |
| 9,673,041 B2 | 6/2017 | Swaminathan et al. |
| 9,685,320 B2 | 6/2017 | Kang et al. |
| 9,721,784 B2 | 8/2017 | Behera et al. |
| 9,786,570 B2 | 10/2017 | Kang et al. |
| 9,793,110 B2 | 10/2017 | Kang et al. |
| 9,865,815 B2 | 1/2018 | Hausmann et al. |
| 9,875,891 B2 | 1/2018 | Henri et al. |
| 9,892,917 B2 | 2/2018 | Swaminathan et al. |
| 9,892,933 B2 | 2/2018 | Peng et al. |
| 9,997,357 B2 | 6/2018 | Arghavani et al. |
| 10,008,428 B2 | 6/2018 | Kang et al. |
| 10,037,884 B2 | 7/2018 | Ou |
| 10,043,655 B2 | 8/2018 | Swaminathan et al. |
| 10,043,657 B2 | 8/2018 | Swaminathan et al. |
| 10,062,563 B2 | 8/2018 | Kumar et al. |
| 10,074,543 B2 | 9/2018 | Mahorowala et al. |
| 10,134,579 B2 | 11/2018 | Baldasseroni et al. |
| 10,141,505 B2 | 11/2018 | Hausmann et al. |
| 2002/0001889 A1 | 1/2002 | Kim et al. |
| 2002/0001929 A1 | 1/2002 | Biberger et al. |
| 2002/0066411 A1 | 6/2002 | Chiang et al. |
| 2002/0076507 A1 | 6/2002 | Chiang et al. |
| 2002/0175393 A1 | 11/2002 | Baum et al. |
| 2003/0008070 A1 | 1/2003 | Seutter et al. |
| 2003/0024477 A1 | 2/2003 | Okuda et al. |
| 2003/0143839 A1 | 7/2003 | Raaijmakers et al. |
| 2003/0143841 A1 | 7/2003 | Yang et al. |
| 2003/0200917 A1 | 10/2003 | Vaartstra |
| 2003/0216006 A1 | 11/2003 | Li et al. |
| 2004/0033698 A1 | 2/2004 | Lee et al. |
| 2004/0043570 A1 | 3/2004 | Fujisaki et al. |
| 2004/0043633 A1 | 3/2004 | Vaartstra |
| 2004/0053515 A1 | 3/2004 | Comita et al. |
| 2004/0121164 A1 | 6/2004 | Iacovangelo et al. |
| 2004/0129212 A1 | 7/2004 | Gadgil et al. |
| 2004/0146644 A1 | 7/2004 | Xiao et al. |
| 2004/0157472 A1 | 8/2004 | Sugino et al. |
| 2004/0219746 A1 | 11/2004 | Vaartstra et al. |
| 2004/0219784 A1 | 11/2004 | Kang et al. |
| 2004/0231799 A1 | 11/2004 | Lee et al. |
| 2005/0005851 A1 | 1/2005 | Keshner et al. |
| 2005/0025885 A1 | 2/2005 | McSwiney et al. |
| 2005/0042865 A1 | 2/2005 | Cabral et al. |
| 2005/0079661 A1 | 4/2005 | Cho et al. |
| 2005/0100670 A1 | 5/2005 | Dussarrat et al. |
| 2005/0109276 A1 | 5/2005 | Iyer et al. |
| 2005/0118837 A1 | 6/2005 | Todd et al. |
| 2005/0142795 A1 | 6/2005 | Ahn et al. |
| 2005/0158983 A1 | 7/2005 | Hoshi et al. |
| 2005/0159017 A1 | 7/2005 | Kim et al. |
| 2005/0170104 A1 | 8/2005 | Jung et al. |
| 2005/0181535 A1 | 8/2005 | Yun et al. |
| 2005/0184397 A1 | 8/2005 | Gates et al. |
| 2005/0196977 A1 | 9/2005 | Saito et al. |
| 2005/0208718 A1 | 9/2005 | Lim et al. |
| 2005/0227017 A1 | 10/2005 | Senzaki et al. |
| 2005/0230047 A1 | 10/2005 | Collins et al. |
| 2005/0233553 A1 | 10/2005 | Kountz et al. |
| 2005/0260347 A1 | 11/2005 | Narwankar et al. |
| 2005/0276099 A1 | 12/2005 | Horng et al. |
| 2005/0287309 A1 | 12/2005 | Veerasamy |
| 2005/0287775 A1 | 12/2005 | Hasebe et al. |
| 2006/0003557 A1 | 1/2006 | Cabral et al. |
| 2006/0008656 A1 | 1/2006 | Veerasamy |
| 2006/0009041 A1 | 1/2006 | Iyer et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0183055 A1 | 8/2006 | O'Neill et al. |
| 2006/0199357 A1 | 9/2006 | Wan et al. |
| 2006/0228868 A1 | 10/2006 | Ahn et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |

(56) References Cited

U.S. PATENT DOCUMENTS

| | | |
|---|---|---|
| 2007/0026540 A1 | 2/2007 | Nooten et al. |
| 2007/0065576 A1 | 3/2007 | Singh et al. |
| 2007/0087574 A1 | 4/2007 | Gupta et al. |
| 2007/0087581 A1 | 4/2007 | Singh et al. |
| 2007/0099431 A1 | 5/2007 | Li |
| 2007/0116887 A1 | 5/2007 | Faguet |
| 2007/0134942 A1 | 6/2007 | Ahn et al. |
| 2007/0137572 A1 | 6/2007 | Matsuura et al. |
| 2007/0145483 A1 | 6/2007 | Ono |
| 2007/0167028 A1 | 7/2007 | Chou et al. |
| 2007/0215036 A1 | 9/2007 | Park et al. |
| 2007/0218661 A1 | 9/2007 | Shroff et al. |
| 2007/0218701 A1 | 9/2007 | Shimizu et al. |
| 2007/0231487 A1 | 10/2007 | Ishizaka |
| 2007/0232082 A1 | 10/2007 | Balseanu et al. |
| 2007/0238316 A1 | 10/2007 | Ohashi |
| 2007/0243693 A1 | 10/2007 | Nemani et al. |
| 2007/0251444 A1 | 11/2007 | Gros-Jean et al. |
| 2007/0259110 A1 | 11/2007 | Mahajani et al. |
| 2008/0014759 A1 | 1/2008 | Chua et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0081470 A1 | 4/2008 | Clark |
| 2008/0085610 A1 | 4/2008 | Wang et al. |
| 2008/0087890 A1 | 4/2008 | Ahn et al. |
| 2008/0119057 A1 | 5/2008 | Chua et al. |
| 2008/0123394 A1 | 5/2008 | Lee et al. |
| 2008/0124946 A1 | 5/2008 | Xiao et al. |
| 2008/0131601 A1 | 6/2008 | Kim et al. |
| 2008/0138996 A1 | 6/2008 | Nishizuka |
| 2008/0139003 A1 | 6/2008 | Pirzada et al. |
| 2008/0207007 A1 | 8/2008 | Thridandam et al. |
| 2008/0213479 A1 | 9/2008 | Chou et al. |
| 2008/0237726 A1 | 10/2008 | Dyer |
| 2008/0242116 A1 | 10/2008 | Clark |
| 2008/0260969 A1 | 10/2008 | Dussarrat et al. |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2008/0318443 A1 | 12/2008 | Kim et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0155968 A1 | 6/2009 | Min et al. |
| 2009/0163012 A1 | 6/2009 | Clark et al. |
| 2009/0163041 A1 | 6/2009 | Mungekar et al. |
| 2009/0191687 A1 | 7/2009 | Hong et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0003797 A1 | 1/2010 | Smith |
| 2010/0022099 A1 | 1/2010 | Van Nooten et al. |
| 2010/0025824 A1 | 2/2010 | Chen et al. |
| 2010/0038727 A1 | 2/2010 | Chakravarthi et al. |
| 2010/0048011 A1 | 2/2010 | Yeh et al. |
| 2010/0051578 A1 | 3/2010 | Chang et al. |
| 2010/0051579 A1 | 3/2010 | Kobayashi |
| 2010/0078316 A1 | 4/2010 | Edakawa et al. |
| 2010/0096688 A1 | 4/2010 | Balseanu et al. |
| 2010/0099236 A1 | 4/2010 | Kwon et al. |
| 2010/0099271 A1 | 4/2010 | Hausmann et al. |
| 2010/0102407 A1 | 4/2010 | Kajiyama et al. |
| 2010/0102417 A1 | 4/2010 | Ganguli et al. |
| 2010/0120262 A1 | 5/2010 | Vorsa et al. |
| 2010/0124618 A1 | 5/2010 | Kobayashi et al. |
| 2010/0124621 A1 | 5/2010 | Kobayashi et al. |
| 2010/0126667 A1 | 5/2010 | Yin et al. |
| 2010/0136260 A1 | 6/2010 | Matsunaga et al. |
| 2010/0136313 A1 | 6/2010 | Shimizu et al. |
| 2010/0151681 A1 | 6/2010 | Knapp et al. |
| 2010/0167555 A1 | 7/2010 | Maula et al. |
| 2010/0190353 A1 | 7/2010 | Nguyen et al. |
| 2010/0197129 A1 | 8/2010 | Ishikawa |
| 2010/0216268 A1 | 8/2010 | Katayama et al. |
| 2010/0221925 A1 | 9/2010 | Lee et al. |
| 2010/0255218 A1 | 10/2010 | Oka et al. |
| 2010/0304047 A1 | 12/2010 | Yang et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0003477 A1 | 1/2011 | Park et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0021010 A1 | 1/2011 | Cheng et al. |
| 2011/0042744 A1 | 2/2011 | Cheng et al. |
| 2011/0064969 A1 | 3/2011 | Chen et al. |
| 2011/0086516 A1 | 4/2011 | Lee et al. |
| 2011/0124187 A1 | 5/2011 | Afzali-Ardakani et al. |
| 2011/0127582 A1 | 6/2011 | Cheng et al. |
| 2011/0129978 A1 | 6/2011 | Cheng et al. |
| 2011/0139176 A1 | 6/2011 | Cheung et al. |
| 2011/0143548 A1 | 6/2011 | Cheung et al. |
| 2011/0151142 A1 | 6/2011 | Seamons et al. |
| 2011/0151246 A1 | 6/2011 | Ramon Moreno et al. |
| 2011/0151674 A1 | 6/2011 | Tang et al. |
| 2011/0151678 A1 | 6/2011 | Ashtiani et al. |
| 2011/0159202 A1 | 6/2011 | Matsushita et al. |
| 2011/0176967 A1 | 7/2011 | Okuda et al. |
| 2011/0183528 A1 | 7/2011 | Wang et al. |
| 2011/0198756 A1 | 8/2011 | Thenappan et al. |
| 2011/0201210 A1 | 8/2011 | Sato et al. |
| 2011/0215445 A1 | 9/2011 | Yang et al. |
| 2011/0244142 A1 | 10/2011 | Cheng et al. |
| 2011/0256726 A1 | 10/2011 | LaVoie et al. |
| 2011/0256734 A1 | 10/2011 | Hausmann et al. |
| 2011/0298099 A1 | 12/2011 | Lee et al. |
| 2011/0309475 A1 | 12/2011 | Lee |
| 2012/0009802 A1 | 1/2012 | LaVoie et al. |
| 2012/0009803 A1 | 1/2012 | Jung et al. |
| 2012/0021252 A1 | 1/2012 | Lee |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0064682 A1 | 3/2012 | Jang et al. |
| 2012/0074844 A1 | 3/2012 | York et al. |
| 2012/0077349 A1 | 3/2012 | Li et al. |
| 2012/0086048 A1 | 4/2012 | Park et al. |
| 2012/0104347 A1 | 5/2012 | Quick |
| 2012/0108079 A1 | 5/2012 | Mahajani |
| 2012/0113672 A1 | 5/2012 | Dubrow et al. |
| 2012/0142194 A1 | 6/2012 | Hwang |
| 2012/0156882 A1 | 6/2012 | Lee et al. |
| 2012/0156888 A1 | 6/2012 | Sato et al. |
| 2012/0161405 A1 | 6/2012 | Mohn et al. |
| 2012/0164846 A1 | 6/2012 | Ha et al. |
| 2012/0177841 A1 | 7/2012 | Thompson |
| 2012/0193693 A1 | 8/2012 | Kanaya |
| 2012/0213940 A1 | 8/2012 | Mallick |
| 2012/0244711 A1 | 9/2012 | Yin et al. |
| 2012/0258261 A1 | 10/2012 | Reddy et al. |
| 2012/0264305 A1 | 10/2012 | Nakano |
| 2012/0280200 A1 | 11/2012 | Tada et al. |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0058161 A1 | 3/2013 | Yamanaka et al. |
| 2013/0058162 A1 | 3/2013 | Yamanaka et al. |
| 2013/0071580 A1 | 3/2013 | Weidman et al. |
| 2013/0084688 A1 | 4/2013 | O'Meara et al. |
| 2013/0115783 A1 | 5/2013 | Kim et al. |
| 2013/0189845 A1 | 7/2013 | Kim et al. |
| 2013/0189854 A1 | 7/2013 | Hausmann et al. |
| 2013/0196516 A1 | 8/2013 | Lavoie et al. |
| 2013/0210236 A1 | 8/2013 | Ogihara et al. |
| 2013/0252437 A1 | 9/2013 | Sano et al. |
| 2013/0309415 A1 | 11/2013 | Swaminathan et al. |
| 2013/0319329 A1 | 12/2013 | Li et al. |

(56) References Cited

U.S. PATENT DOCUMENTS

| | | |
|---|---|---|
| 2013/0344248 A1 | 12/2013 | Clark |
| 2014/0023794 A1 | 1/2014 | Mahajani et al. |
| 2014/0030444 A1 | 1/2014 | Swaminathan et al. |
| 2014/0049162 A1 | 2/2014 | Thomas et al. |
| 2014/0051262 A9 | 2/2014 | Lavoie et al. |
| 2014/0087066 A1 | 3/2014 | Wang et al. |
| 2014/0094035 A1 | 4/2014 | Ji et al. |
| 2014/0106574 A1 | 4/2014 | Kang et al. |
| 2014/0113455 A1 | 4/2014 | Reimer et al. |
| 2014/0113457 A1 | 4/2014 | Sims et al. |
| 2014/0120270 A1 | 5/2014 | Tour et al. |
| 2014/0120737 A1 | 5/2014 | Swaminathan et al. |
| 2014/0134812 A1 | 5/2014 | Kim et al. |
| 2014/0134827 A1 | 5/2014 | Swaminathan et al. |
| 2014/0141542 A1 | 5/2014 | Kang et al. |
| 2014/0141625 A1 | 5/2014 | Fukazawa et al. |
| 2014/0141626 A1 | 5/2014 | Hausmann et al. |
| 2014/0170853 A1 | 6/2014 | Shamma et al. |
| 2014/0182619 A1 | 7/2014 | Goto et al. |
| 2014/0193983 A1 | 7/2014 | LaVoie |
| 2014/0209562 A1 | 7/2014 | LaVoie et al. |
| 2014/0216337 A1 | 8/2014 | Swaminathan et al. |
| 2014/0239462 A1 | 8/2014 | Shamma et al. |
| 2014/0262038 A1 | 9/2014 | Wang et al. |
| 2014/0264555 A1 | 9/2014 | Ahn et al. |
| 2014/0273428 A1 | 9/2014 | Shero et al. |
| 2014/0273477 A1 | 9/2014 | Niskanen et al. |
| 2014/0273528 A1 | 9/2014 | Niskanen et al. |
| 2014/0273529 A1 | 9/2014 | Nguyen et al. |
| 2014/0273530 A1 | 9/2014 | Nguyen et al. |
| 2014/0273531 A1 | 9/2014 | Niskanen et al. |
| 2014/0295084 A1 | 10/2014 | Shirai et al. |
| 2014/0302686 A1 | 10/2014 | Pan et al. |
| 2015/0021712 A1 | 1/2015 | Zschaetzsch et al. |
| 2015/0031218 A1 | 1/2015 | Karakawa |
| 2015/0041867 A1 | 2/2015 | Han |
| 2015/0048740 A1 | 2/2015 | Valcore, Jr. et al. |
| 2015/0056540 A1 | 2/2015 | Fukuda |
| 2015/0093902 A1 | 4/2015 | Huang et al. |
| 2015/0109814 A1 | 4/2015 | Chen et al. |
| 2015/0126042 A1 | 5/2015 | Pasquale et al. |
| 2015/0137061 A1 | 5/2015 | Donghi et al. |
| 2015/0147483 A1 | 5/2015 | Fukazawa |
| 2015/0155198 A1 | 6/2015 | Tsai et al. |
| 2015/0159271 A1 | 6/2015 | Lee et al. |
| 2015/0162416 A1 | 6/2015 | Chang et al. |
| 2015/0170900 A1 | 6/2015 | LaVoie |
| 2015/0200110 A1 | 7/2015 | Li et al. |
| 2015/0206719 A1 | 7/2015 | Swaminathan et al. |
| 2015/0235835 A1 | 8/2015 | Swaminathan et al. |
| 2015/0243708 A1 | 8/2015 | Ravasio et al. |
| 2015/0243883 A1 | 8/2015 | Swaminathan et al. |
| 2015/0249013 A1 | 9/2015 | Arghavani et al. |
| 2015/0249153 A1 | 9/2015 | Morin et al. |
| 2015/0259791 A1 | 9/2015 | Hausmann et al. |
| 2015/0294905 A1 | 10/2015 | Wu et al. |
| 2016/0020092 A1 | 1/2016 | Kang et al. |
| 2016/0046501 A1 | 2/2016 | Kverel et al. |
| 2016/0049307 A1 | 2/2016 | Chen |
| 2016/0064211 A1 | 3/2016 | Swaminathan et al. |
| 2016/0064224 A1 | 3/2016 | Hung et al. |
| 2016/0079054 A1 | 3/2016 | Chen et al. |
| 2016/0093484 A1 | 3/2016 | Marsh |
| 2016/0099143 A1 | 4/2016 | Yan et al. |
| 2016/0118246 A1 | 4/2016 | Kang et al. |
| 2016/0148800 A1 | 5/2016 | Henri et al. |
| 2016/0148806 A1 | 5/2016 | Henri et al. |
| 2016/0155676 A1 | 6/2016 | Kang et al. |
| 2016/0155739 A1 | 6/2016 | Ting et al. |
| 2016/0163539 A9 | 6/2016 | Kang et al. |
| 2016/0163972 A1 | 6/2016 | Swaminathan et al. |
| 2016/0172194 A1 | 6/2016 | Kunnen et al. |
| 2016/0225640 A1 | 8/2016 | Raley et al. |
| 2016/0240428 A1 | 8/2016 | Tung et al. |
| 2016/0247678 A1 | 8/2016 | Feng et al. |
| 2016/0247680 A1 | 8/2016 | O'Meara et al. |
| 2016/0251756 A1 | 9/2016 | Lansalot-Matras et al. |
| 2016/0260584 A1 | 9/2016 | Marakhtanov et al. |
| 2016/0284567 A1 | 9/2016 | Reilly et al. |
| 2016/0293385 A1 | 10/2016 | Kapoor et al. |
| 2016/0293398 A1 | 10/2016 | Danek et al. |
| 2016/0293418 A1 | 10/2016 | Pasquale et al. |
| 2016/0293838 A1 | 10/2016 | Swaminathan et al. |
| 2016/0300718 A1 | 10/2016 | Raley et al. |
| 2016/0322215 A1 | 11/2016 | Shaikh |
| 2016/0322371 A1 | 11/2016 | Yonemochi |
| 2016/0329206 A1 | 11/2016 | Kumar et al. |
| 2016/0336178 A1 | 11/2016 | Swaminathan et al. |
| 2016/0336187 A1 | 11/2016 | Liou et al. |
| 2016/0340782 A1 | 11/2016 | Chandrasekharan et al. |
| 2016/0365425 A1 | 12/2016 | Chen et al. |
| 2016/0372334 A1 | 12/2016 | Mignot et al. |
| 2016/0379826 A9 | 12/2016 | Arghavani et al. |
| 2017/0009346 A1 | 1/2017 | Kumar et al. |
| 2017/0069510 A1 | 3/2017 | Kal et al. |
| 2017/0092735 A1 | 3/2017 | Hashemi et al. |
| 2017/0092857 A1 | 3/2017 | Hausmann et al. |
| 2017/0103891 A1 | 4/2017 | Lee et al. |
| 2017/0110364 A1 | 4/2017 | Song et al. |
| 2017/0110533 A1 | 4/2017 | Huang et al. |
| 2017/0117134 A1 | 4/2017 | Henri et al. |
| 2017/0117150 A1 | 4/2017 | Liao et al. |
| 2017/0140926 A1 | 5/2017 | Pore et al. |
| 2017/0148628 A1 | 5/2017 | Swaminathan et al. |
| 2017/0148637 A1 | 5/2017 | deVilliers |
| 2017/0170015 A1 | 6/2017 | Kim et al. |
| 2017/0226637 A1 | 8/2017 | Lubomirsky et al. |
| 2017/0263450 A1 | 9/2017 | Swaminathan et al. |
| 2017/0316988 A1 | 11/2017 | Kang et al. |
| 2017/0323785 A1 | 11/2017 | Singhal et al. |
| 2017/0323786 A1 | 11/2017 | Kang et al. |
| 2018/0005801 A1 | 1/2018 | Singhal et al. |
| 2018/0005814 A1 | 1/2018 | Kumar et al. |
| 2018/0033622 A1 | 2/2018 | Swaminathan et al. |
| 2018/0061628 A1 | 3/2018 | Ou et al. |
| 2018/0061650 A1 | 3/2018 | Mahorowala |
| 2018/0114903 A1 | 4/2018 | Hausmann |
| 2018/0138028 A1 | 5/2018 | Henri et al. |
| 2018/0138036 A1 | 5/2018 | Baldasseroni et al. |
| 2018/0138040 A1 | 5/2018 | LaVoie |
| 2018/0138405 A1 | 5/2018 | McKerrow et al. |
| 2018/0247875 A1 | 8/2018 | Kang et al. |
| 2018/0269061 A1 | 9/2018 | Arghavani et al. |
| 2018/0323057 A1 | 11/2018 | Kumar et al. |

FOREIGN PATENT DOCUMENTS

| | | |
|---|---|---|
| CN | 1926668 A | 3/2007 |
| CN | 101006195 A | 7/2007 |
| CN | 101255548 A | 9/2008 |
| CN | 101328578 A | 12/2008 |
| CN | 101378007 A | 3/2009 |
| CN | 101416293 A | 4/2009 |
| CN | 101535524 A | 9/2009 |
| CN | 101736326 A | 6/2010 |
| CN | 101889331 A | 11/2010 |
| CN | 102005462 A | 4/2011 |
| CN | 102191479 A | 9/2011 |
| CN | 102471885 A | 5/2012 |
| CN | 102687249 A | 9/2012 |
| CN | 102906304 A | 1/2013 |
| CN | 103137864 A | 6/2013 |
| CN | 103225071 A | 7/2013 |
| CN | 103928396 A | 7/2014 |
| CN | 105391427 A | 3/2016 |
| CN | 105719954 A | 6/2016 |
| EP | 0 277 766 | 8/1988 |
| EP | 0 541 212 | 5/1993 |
| EP | 1 703 552 A2 | 9/2006 |
| EP | 2 278 046 | 1/2011 |
| GB | 1 181 559 | 2/1970 |
| JP | S48-043472 A | 6/1973 |
| JP | H02-093071 A | 4/1990 |
| JP | H03-011635 | 1/1991 |

(56) References Cited

FOREIGN PATENT DOCUMENTS

| | | |
|---|---|---|
| JP | H06-177120 A | 6/1994 |
| JP | H09-102494 A | 4/1997 |
| JP | H09-219401 A | 8/1997 |
| JP | 10-98032 | 4/1998 |
| JP | H10-189467 A | 7/1998 |
| JP | H11-172439 | 6/1999 |
| JP | 2001-274404 | 10/2001 |
| JP | 2001-338922 A | 12/2001 |
| JP | 2002-9072 | 1/2002 |
| JP | 2002-134497 A | 5/2002 |
| JP | 2002-164345 A | 6/2002 |
| JP | 2002-539640 A | 11/2002 |
| JP | 2005-210076 A | 8/2005 |
| JP | 2005-310927 | 11/2005 |
| JP | 2006-060091 | 3/2006 |
| JP | 2007-165883 | 6/2007 |
| JP | 2007-180362 A | 7/2007 |
| JP | 2007-189173 A | 7/2007 |
| JP | 2007-281181 A | 10/2007 |
| JP | 2007-287889 A | 11/2007 |
| JP | 2007-287890 A | 11/2007 |
| JP | 2008-500742 A | 1/2008 |
| JP | 2008-506262 A | 2/2008 |
| JP | 2008-060455 A | 3/2008 |
| JP | 2008-109093 A | 5/2008 |
| JP | 2008-517479 | 5/2008 |
| JP | 2008-182199 A | 8/2008 |
| JP | 2008-258591 A | 10/2008 |
| JP | 2009-65203 A | 3/2009 |
| JP | 2009-540128 A | 11/2009 |
| JP | 4364320 B2 | 11/2009 |
| JP | 2010-10497 | 1/2010 |
| JP | 2010-043081 A | 2/2010 |
| JP | 2010-103484 A | 5/2010 |
| JP | 2010-118664 A | 5/2010 |
| JP | 2010-152136 | 7/2010 |
| JP | 2010-183069 A | 8/2010 |
| JP | 2010-245518 A | 10/2010 |
| JP | 2010-283388 A | 12/2010 |
| JP | 2011-023576 A | 2/2011 |
| JP | 2011-023655 A | 2/2011 |
| JP | 2011-054968 A | 3/2011 |
| JP | 11-067744 | 4/2011 |
| JP | 2011-187934 A | 9/2011 |
| JP | 2012-199306 | 10/2012 |
| JP | 2013166965 A | 8/2013 |
| JP | 2013225655 A | 10/2013 |
| JP | 2014-532304 A | 12/2014 |
| KR | 10-2001-0111448 | 12/2001 |
| KR | 10-0356473 B1 | 10/2002 |
| KR | 10-2004-0001036 | 1/2004 |
| KR | 10-2006-0056883 | 5/2006 |
| KR | 10-0721503 B1 | 5/2007 |
| KR | 10-0734748 B | 7/2007 |
| KR | 10-2009-0057665 | 6/2009 |
| KR | 10-2009-0080019 | 7/2009 |
| KR | 10-2009-0081396 | 7/2009 |
| KR | 10-2009-0116433 | 11/2009 |
| KR | 10-20130056608 A | 5/2013 |
| TW | 200701341 | 1/2007 |
| TW | 2007/21306 | 6/2007 |
| TW | 201009942 A | 3/2010 |
| TW | 201042706 A1 | 12/2010 |
| TW | 2011/13934 A1 | 4/2011 |
| TW | 201140695 A1 | 11/2011 |
| TW | 201144475 A1 | 12/2011 |
| WO | WO 2004/032196 | 4/2004 |
| WO | WO 2006/014471 | 2/2006 |
| WO | WO 2006/018441 | 2/2006 |
| WO | WO 2006/026350 | 3/2006 |
| WO | WO 2006/104741 | 10/2006 |
| WO | WO 2007/043709 | 4/2007 |
| WO | WO 2007/118026 | 10/2007 |
| WO | WO 2011/087580 | 7/2011 |
| WO | WO 2011/087850 | 7/2011 |
| WO | WO 2011/130326 | 10/2011 |
| WO | WO 2011/130397 | 10/2011 |
| WO | WO 2012/040317 | 3/2012 |
| WO | WO 2012/048094 | 4/2012 |
| WO | WO 2012/087737 | 6/2012 |
| WO | WO 2013/032786 | 3/2013 |
| WO | WO 2013/043330 | 3/2013 |
| WO | WO 2013/065806 | 5/2013 |
| WO | WO 2013/112727 | 8/2013 |

OTHER PUBLICATIONS

U.S. Office Action dated Oct. 1, 2015 issued in U.S. Appl. No. 14/552,245.
U.S. Notice of Allowance dated Feb. 1, 2016 issued in U.S. Appl. No. 14/552,245.
U.S. Office Action dated May 24, 2016 issued in U.S. Appl. No. 14/552,245.
U.S. Notice of Allowance dated Oct. 26, 2016 issued in U.S. Appl. No. 14/552,245.
U.S. Office Action dated May 25, 2016 issued in U.S. Appl. No. 14/552,011.
U.S. Notice of Allowance dated Sep. 26, 2016 issued in U.S. Appl. No. 14/552,011.
U.S. Notice of Allowance dated Sep. 28, 2017 issued in U.S. Appl. No. 15/399,637.
U.S. Notice of Allowance dated Jul. 15, 2016 issued in U.S. Appl. No. 14/678,736.
U.S. Office Action dated Apr. 18, 2016 issued in U.S. Appl. No. 14/935,317.
U.S. Notice of Allowance dated Sep. 19, 2016 issued in U.S. Appl. No. 14/935,317.
U.S. Office Action dated May 19, 2017 issued in U.S. Appl. No. 15/272,222.
U.S. Notice of Allowance dated Sep. 1, 2017 issued in U.S. Appl. No. 15/272,222.
U.S. Office Action dated Apr. 7, 2017 issued in U.S. Appl. No. 15/279,314.
U.S. Final Office Action dated Oct. 19, 2017 issued in U.S. Appl. No. 15/279,314.
U.S. Office Action dated Sep. 14, 2012 issued in U.S. Appl. No. 13/084,305.
U.S. Final Office Action dated Apr. 25, 2013 issued in U.S. Appl. No. 13/084,305.
U.S. Office Action dated Jun. 7, 2013 issued U.S. Appl. No. 13/414,619.
U.S. Notice of Allowance dated Jul. 26, 2013, issued U.S. Appl. No. 13/414,619.
U.S. Office Action dated Apr. 11, 2014 issued in U.S. Appl. No. 14/065,334.
U.S. Final Office Action dated Nov. 14, 2014 issued in U.S. Appl. No. 14/065,334.
U.S. Notice of Allowance dated Feb. 17, 2015 issued in U.S. Appl. No. 14/065,334.
U.S. Notice of Allowance dated Feb. 8, 2017 issued in U.S. Appl. No. 14/713,639.
PCT Invitation to Pay Additional Fees; Communication Re Partial International Search, dated Dec. 16, 2011, issued in Application No. PCT/US2011/032303.
PCT International Search Report and Written Opinion, dated Feb. 20, 2012, issued in Application No. PCT/US2011/032303.
PCT International Preliminary Report on Patentability and Written Opinion, dated Oct. 26, 2012, issued in Application No. PCT/US2011/032303.
Chinese First Office Action dated May 19, 2016 issued in Application No. CN 201310021460.8.
Chinese Second Office Action dated Apr. 13, 2017 issued in Application No. CN 201310021460.8.
Chinese Third Office Action dated Oct. 17, 2017 issued in Application No. CN 201310021460.8.
European Extended Search Report dated Apr. 14, 2014 issued in Application No. EP 13 152 046.2.

(56) References Cited

OTHER PUBLICATIONS

Japanese Office Action dated Jan. 10, 2017 issued in Application No. JP 2013-007612.
Korean Notice of Provisional Rejection dated Dec. 6, 2013 issued in Application No. KR 10-2012-0043797.
Korean Final Office Action dated Aug. 18, 2014 issued in Application No. KR 10-2012-0043797.
Korean Decision from the Patent Tribunal of the KIPO [description] dated May 26, 2015 issued in Application No. KR 10-2012-0043797.
Taiwan Examination Report dated Mar. 29, 2017 issued in Application No. TW 102102054.
Aboaf, J.A. (1969) "Some Properties of Vapor Deposited Silicon Nitride Films Obtained by the Reaction of SiBr4 and NH 3," *Journal of the Electrochemical Society*, 116(12):1736-1740.
Becker, F.S. and Rohl, S. (Nov. 1987) "Low Pressure Deposition of Doped $SiO_2$ by Pyrolysis of Tetraethylorthosilicate (TEOS)," *J. Electrochem. Soc.: Solid-State Science and Technology*, 134(11):2923-2931.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
King, Sean W., (Jul./Aug. 2011) "Plasma enhanced atomic layer deposition of $SiN_x$:H and $SiO^2$," *J. Vac. Sci. Technol.* A29(4):041501-1 through 041501-9 (9 pages).
Kunnen et al., (2015) "A way to integrate multiple block layers for middle of line contact patterning," *Proc. of SPIE*, 9428:94280W1-8 [Downloaded on Jun. 27, 2017 from http://proceedings.spiedigitallibrary.org].
Lin et al., (1998) "Silicon Nitride Films Deposited by Atmospheric Pressure Chemical Vapor Deposition," *Materials Research Society Symposium Proceedings vol. 495, Chemical Aspects of Electronic Ceramics Processing*, Symposium held Nov. 30-Dec. 4, 1997, Boston, Massachusetts, U.S.A., 8 pages.
Plasma Enhanced Atomic Layer Deposition (PEALD), Website: http://www.asm.com/index.php?option=com_content&task=view&id=19&Itemid=161 (2010), 1 page.
"PlasmaPro™ NGP®80 Range," *Oxford Instruments* (2010), 8 pages.
*Wikipedia, The Free Encyclopedia*, Definition of "Silicon Nitride," Archived from Apr. 9, 2015, 1 page [Downloaded on Oct. 12, 2017 from https://web.archive.org/web/20150409055521/https://en.wikipedia.org/wiki/Silicon_nitride].
U.S. Office Action dated Mar. 15, 2013 issued in U.S. Appl. No. 13/084,399.
U.S. Final Office Action dated Sep. 13, 2013 issued in U.S. Appl. No. 13/084,399.
U.S. Notice of Allowance dated Jan. 15, 2014 issued in U.S. Appl. No. 13/084,399.
U.S. Office Action dated Jan. 2, 2015 issued in U.S. Appl. No. 14/231,554.
U.S. Final Office Action dated Jun. 10, 2015 issued in U.S. Appl. No. 14/231,554.
U.S. Notice of Allowance dated Aug. 31, 2015 issued in U.S. Appl. No. 14/231,554.
U.S. Office Action dated Apr. 13, 2011 issued in U.S. Appl. No. 12/889,132.
U.S. Notice of Allowance dated Sep. 30, 2011 issued in U.S. Appl. No. 12/889,132.
U.S. Office Action dated Aug. 1, 2012 issued in U.S. Appl. No. 13/011,569.
U.S. Final Office Action dated Feb. 26, 2013 issued in U.S. Appl. No. 13/011,569.
U.S. Notice of Allowance dated May 6, 2013 issued in U.S. Appl. No. 13/011,569.
U.S. Office Action dated Jul. 1, 2016 issued in U.S. Appl. No. 13/963,212.
U.S. Office Action dated Jan. 12, 2017 issued in U.S. Appl. No. 13/963,212.
U.S. Final Office Action dated Jun. 28, 2017 issued in U.S. Appl. No. 13/963,212.
U.S. Office Action dated Apr. 4, 2013 issued U.S. Appl. No. 13/242,084.
U.S. Notice of Allowance dated Jun. 19, 2013 issued U.S. Appl. No. 13/242,084.
U.S. Notice of Allowance dated Sep. 19, 2013 issued U.S. Appl. No. 13/242,084.
U.S. Office Action dated Sep. 21, 2015 issued U.S. Appl. No. 14/607,997.
U.S. Final Office Action dated Mar. 18, 2016 issued U.S. Appl. No. 14/607,997.
U.S. Notice of Allowance dated Jun. 16, 2016 issued U.S. Appl. No. 14/607,997.
U.S. Notice of Allowance dated Sep. 27, 2016 issued U.S. Appl. No. 14/607,997.
U.S. Office Action dated Sep. 26, 2017 issued in U.S. Appl. No. 15/426,889.
U.S. Notice of Allowance dated Aug. 7, 2014 issued U.S. Appl. No. 14/133,239.
U.S. Notice of Allowance dated Nov. 26, 2014 issued U.S. Appl. No. 14/133,239.
U.S. Office Action dated Apr. 29, 2013 issued U.S. Appl. No. 13/224,240.
U.S. Final Office Action dated Nov. 22, 2013 issued U.S. Appl. No. 13/224,240.
U.S. Examiner's Answer to Appeal Brief (filed May 22, 2014) Before the Patent Trial and Appeal Board dated Aug. 14, 2014 issued U.S. Appl. No. 13/224,240.
U.S. Patent Board Decision on Appeal Before the Patent Trial and Appeal Board (Examiner Affirmed) dated Aug. 11, 2016 issued U.S. Appl. No. 13/224,240.
U.S. Notice of Allowance dated Nov. 17, 2016 issued U.S. Appl. No. 13/224,240.
U.S. Notice of Allowance (Supplemental Notice of Allowability) dated Feb. 21, 2017 issued U.S. Appl. No. 13/224,240.
U.S. Office Action dated May 24, 2013 issued U.S. Appl. No. 13/472,282.
U.S. Notice of Allowance dated Oct. 4, 2013 issued U.S. Appl. No. 13/472,282.
U.S. Office Action dated May 21, 2014 issued in U.S. Appl. No. No. 13/607,386.
U.S. Notice of Allowance dated Oct. 8, 2014 issued in U.S. Appl. No. 13/607,386.
U.S. Notice of Allowance dated Nov. 19, 2014 issued in U.S. Appl. No. 13/607,386.
U.S. Office Action dated Jun. 13, 2014 issued in U.S. Appl. No. 13/953,616.
U.S. Final Office Action dated Nov. 24, 2014 issued in U.S. Appl. No. 13/953,616.
U.S. Office Action dated Dec. 11, 2014 issued in U.S. Appl. No. 14/074,596.
U.S. Office Action dated Dec. 24, 2015 issued in U.S. Appl. No. 14/074,596.
U.S. Notice of Allowance dated Feb. 12, 2016 issued in U.S. Appl. No. 14/074,596.
U.S. Office Action dated May 15, 2015 issued in U.S. Appl. No. 14/074,617.
U.S. Notice of Allowance dated Nov. 20, 2015 issued in U.S. Appl. No. 14/074,617.
U.S. Office Action dated Dec. 30, 2016 issued in U.S. Appl. No. 15/015,952.
U.S. Notice of Allowance dated Jun. 15, 2017 issued in U.S. Appl. No. 15/015,952.
U.S. Office Action dated Aug. 14, 2015 issued in U.S. Appl. No. 14/061,587.
U.S. Notice of Allowance dated Feb. 11, 2016 issued in U.S. Appl. No. 14/061,587.
U.S. Notice of Allowance [Supplemental Notice of Allowability] dated Mar. 1, 2016 issued in U.S. Appl. No. 14/061,587.
U.S. Office Action dated Mar. 2, 2015 issued in U.S. Appl. No. 14/137,860.

(56) References Cited

OTHER PUBLICATIONS

U.S. Notice of Allowance dated Oct. 1, 2015 issued in U.S. Appl. No. 14/137,860.
U.S. Notice of Allowance [Supplemental Notice of Allowability] dated Oct. 22, 2015 issued in U.S. Appl. No. 14/137,860.
U.S. Office Action dated Feb. 3, 2017 issued in U.S. Appl. No. 14/987,542.
U.S. Notice of Allowance dated Jun. 20, 2017 issued in U.S. Appl. No. 14/987,542.
U.S. Notice of Allowance dated Aug. 22, 2017 issued in U.S. Appl. No. 14/987,542.
U.S. Office Action dated Jul. 10, 2014 issued in U.S. Appl. No. 14/144,107.
U.S. Final Office Action dated Jan. 15, 2015 issued in U.S. Appl. No. 14/144,107.
U.S. Notice of Allowance dated Mar. 19, 2015 issued in U.S. Appl. No. 14/144,107.
U.S. Office Action dated Oct. 21, 2015 issued in U.S. Appl. No. 14/194,549.
U.S. Final Office Action dated Nov. 1, 2016 issued in U.S. Appl. No. 14/194,549.
U.S. Office Action dated Apr. 19, 2017 issued in U.S. Appl. No. 14/194,549.
U.S. Final Office Action dated Sep. 20, 2017 issued in U.S. Appl. No. 14/194,549.
U.S. Notice of Allowance dated Aug. 5, 2015 issued in U.S. Appl. No. 14/183,287.
U.S. Office Action dated Aug. 1, 2016 issued in U.S. Appl. No. 14/932,869.
U.S. Office Action dated Jul. 2, 2015 issued in U.S. Appl. No. 14/187,145.
U.S. Final Office Action dated Dec. 16, 2015 issued in Application No. 14/187,145 [LAMRP083].
U.S. Notice of Allowance dated Feb. 25, 2016 issued in U.S. Appl. No. 14/187,145.
U.S. Office Action dated Jun. 9, 2017 issued in U.S. Appl. No. 15/224,347.
U.S. Notice of Allowance dated Oct. 4, 2017 issued in U.S. Appl. No. 15/224,347.
U.S. Office Action dated Jun. 14, 2016 issued in U.S. Appl. No. 15/019,904.
U.S. Notice of Allowance dated Oct. 13, 2016 issued in U.S. Appl. No. 15/019,904.
U.S. Office Action dated Nov. 25, 2016 issued in U.S. Appl. No. 15/178,474.
U.S. Notice of Allowance dated Feb. 10, 2017 issued in U.S. Appl. No. 15/178,474.
U.S. Notice of Allowance dated Mar. 27, 2017 issued in U.S. Appl. No. 15/178,474.
U.S. Notice of Allowance dated Apr. 18, 2017 issued in U.S. Appl. No. 15/178,474.
U.S. Office Action dated Aug. 22, 2017 issued in U.S. Appl. No. 15/609,864.
U.S. Office Action dated Apr. 13, 2015 issued in U.S. Appl. No. 14/335,785.
U.S. Final Office Action dated Aug. 24, 2016 issued in U.S. Appl. No. 14/335,785.
U.S. Notice of Allowance dated Nov. 4, 2016 issued in U.S. Appl. No. 14/335,785.
U.S. Notice of Allowance dated Feb. 22, 2017 issued in U.S. Appl. No. 14/335,785.
U.S. Notice of Allowance dated Mar. 21, 2017 issued in U.S. Appl. No. 14/335,785.
U.S. Notice of Allowance [Corrected Notice of Allowability] dated Apr. 19, 2017 issued in U.S. Appl. No. 14/335,785.
PCT International Search Report and Written Opinion, dated Oct. 20, 2011, issued in Application No. PCT/US2011/032186.
PCT International Preliminary Report on Patentability, dated Oct. 26, 2012, issued in Application No. PCT/US2011/032186.
Korean Office Action, dated Feb. 7, 2017, issued in Application No. KR 10-2012-7004925.
Korean Office Action, dated Aug. 23, 2017, issued in Application No. KR 10-2017-7020548.
Taiwan Office Action dated Apr. 27, 2016 issued in Application No. TW 100113041.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
Chinese First Office Action dated Jun. 2, 2015 issued in Application No. CN 201180045808.6.
Chinese Second Office Action dated Feb. 2, 2016 issued in Application No. CN 201180045808.6.
Korean Office Action, dated May 23, 2017, issued in Application No. KR 10-2013-7010291.
Taiwan Office Action dated May 5, 2016 issued in Application No. TW 100134208.
Taiwan Office Action [no translation] dated Oct. 19, 2017 issued in Application No. TW 105130207.
PCT International Search Report and Written Opinion dated Dec. 18, 2012, issued in Application No. PCT/US2012/052769.
PCT International Preliminary Report on Patentability and Written Opinion dated Apr. 3, 2014, issued in Application No. PCT/US2012/052769.
Chinese First Office Action dated Nov. 19, 2015 issued in Application No. CN 201280046487.6.
Chinese Second Office Action dated Aug. 22, 2016 issued in Application No. CN 201280046487.6.
Japanese Office Action dated Aug. 23, 2016 issued in Application No. JP 2014-531838.
Singapore Supplementary Examination Report dated Jun. 1, 2016 issued in Application No. SG 11201400633R.
Taiwan Notice of Allowance and Search Report dated Dec. 18, 2015 issued in Application No. TW 101134692.
PCT International Search Report and Written Opinion dated Feb. 28, 2013, issued in Application No. PCT/US2012/051740.
PCT International Preliminary Report on Patentability and Written Opinion dated Mar. 13, 2014, issued in Application No. PCT/US2012/051740.
Chinese First Office Action dated Nov. 6, 2015 issued in Application No. CN 201280053888.4.
Chinese Second Office Action dated Aug. 16, 2016 issued in Application No. CN 201280053888.4.
Korean First Office Action dated Oct. 31, 2017 issued in Application No. KR 10-2014-7008696.
Taiwan Office Action and Search Report dated Jan. 27, 2016 issued in Application No. TW 101131556.
Taiwan Office Action and Search Report dated Nov. 9, 2016 issued in Application No. TW 101131556.
European Extended Search Report dated Apr. 14, 2014 issued in Application No. EP 13 15 2046.
PCT International Search Report and Written Opinion dated May 27, 2013, issued in Application No. PCT/US2013/022977.
PCT International Preliminary Report on Patentability and Written Opinion dated Aug. 7, 2014, issued in Application No. PCT/US2013/022977.
Chinese First Office Action dated Feb. 22, 2016 issued in Application No. CN 201380006994.1.
Chinese Second Office Action dated Feb. 6, 2017 issued in Application No. CN 201380006994.1.
Japanese Notification of Reasons for Rejection dated Jan. 10, 2017 issued in Application No. JP2014-554825.
Singapore Supplementary Examination Report dated Aug. 11, 2016 issued in Application No. SG 11201404315R.
Taiwan Office Action and Search Report dated Jul. 20, 2016 issued in Application No. TW 102102879.

(56) References Cited

OTHER PUBLICATIONS

Taiwan Office Action dated Oct. 25, 2016 issued in Application No. TW 102117772.
Taiwan Rejection Decision dated Aug. 17, 2017 issued in Application No. TW 102117772.
Japanese Office Action [no translation] dated Oct. 31, 2017 issued in Application No. JP 2013-230782.
Taiwan Examination Report dated Jul. 13, 2017 issued in Application No. TW 102140721.
Taiwan Examination Report dated Jan. 11, 2017 issued in Application No. TW 102138326.
Chinese First Office Action dated Nov. 28, 2016 issued in Application No. CN 201410521390.7.
Chinese First Office Action dated May 27, 2017 issued in Application No. CN 201510091775.9.
Chinese First Office Action dated Apr. 11, 2016 issued in Application No. CN 201510086588.1.
Chinese Second Office Action dated Mar. 20, 2017 issued in Application No. CN 201510086588.1.
Japanese Office Action dated Apr. 19, 2016 issued in Application No. JP 2015-21804.
Korean First Office Action dated Feb. 19, 2016, issued in Application No. KR 10-2015-0022610.
Korean Final Office Action dated Jun. 29, 2016, issued in Application No. KR 10-2015-0022610.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
Faraz et al., (2015) "Atomic Layer Etching: What Can We Learn from Atomic Layer Deposition?," *ECS Journal of Solid State Science and Technology*, 4(6):N5023-N5032.
Hausmann et al., (2002) "Atomic Layer Deposition of Hafnium and Zirconium Oxides Using Metal Amide Precursors," *Chem. Mater.* 14(10):4350-4358.
Kim, H., et al., (2002) "The Growth of Tantalum Thin Films by Plasma-Enhanced Atomic Layer Deposition and Diffusion Barrier Properties," *Mat. Res. Soc. Symp. Proc.* 716:B8.5.1-B8.5.6.
Ko, Myoung-Gyun, et al., "Characterization of ruthenium thin film deposited by rf-direct plasma atomic layer deposition," *209th ECS Meeting*, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," *Journal of the Korean Physical Society*, 53(4):2123-2128.
Lavareda et al., (2004) "Properties of a-Si:H TFTs using silicon carbonitride as dielectric," *Journal of Non-Crystalline Solids*, 338-340:797-801.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Li, Xingcun, et al., (2011) "Atomic Layer Deposition $Al_2O_3$ Thin Films in Magnetized Radio Frequency Plasma Source," *Physics Procedia* 18:100-106.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Pritchett, Merry, (May 2004) "Adherence/Diffusion Barrier Layers for Copper Metallization: Amorphous Carbon:Silicon Polymerized Films," Dissertation Prepared for the Degree of Doctor of Philosophy, University of Texas, 113pp.
Puurunen, Riikka L. (2005) "Surface chemistry of atomic layer deposition: A case study for the trimethylaluminum/water process," *Journal of Applied Physics*, 97:121301-1-121301-52.
van der Straten et al., (2004) "Atomic layer deposition of tantalum nitride for ultrathin liner applications in advanced copper metallization schemes," *Journal of Materials Research*, 19(2):447-453.
Huang et al. (2017) "Design of efficient mono-aminosilane precursors for atomic layer deposition of $SiO_2$ thin films," *Royal Society of Chemistry Adv.* 2017, 7:22672-22678.
U.S. Appl. No. 15/201,221, filed Jul. 1, 2016, Kumar et al.
U.S. Appl. No. 15/253,301, filed Aug. 31, 2016, Ou et al.
U.S. Appl. No. 15/253,546, filed Aug. 31, 2016, Mahorowala et al.
U.S. Appl. No. 15/279,312, filed Sep. 28, 2016, Swaminathan et al.
U.S. Appl. No. 15/349,746, filed Nov. 11, 2016, LaVoie.
U.S. Appl. No. 15/349,753, filed Nov. 11, 2016, McKerrow et al.
U.S. Appl. No. 15/351,221, filed Nov. 14, 2016, Baldasseroni et al.
U.S. Appl. No. 15/683,397, filed Aug. 22, 2017, Singhal et al.
U.S. Office Action dated Oct. 6, 2017 issued in U.S. Appl. No. 15/253,546.
U.S. Office Action dated Jun. 29, 2017 issued in U.S. Appl. No. 15/279,312.
U.S. Office Action dated Jul. 5, 2017 issued in U.S. Appl. No. 15/351,221.
U.S. Office Action dated Jul. 14, 2017 issued in U.S. Appl. No. 15/349,746.
U.S. Office Action dated Oct. 23, 2017 issued in U.S. Appl. No. 15/349,753.
U.S. Office Action dated Aug. 18, 2017 issued in U.S. Appl. No. 15/201,221.
U.S. Office Action dated Oct. 6, 2017 issued in U.S. Appl. No. 15/253,301.
U.S. Office Action dated Nov. 9, 2018 issued in U.S. Appl. No. 15/654,186.
U.S. Notice of Allowance dated Feb. 14, 2018 issued in U.S. Appl. No. 14/194,549.
U.S. Notice of Allowance [Corrected Notice of Allowability] dated Nov. 28, 2017 issued in U.S. Appl. No. 15/224,347.
U.S. Final Office Action dated Dec. 4, 2017 issued in U.S. Appl. No. 15/609,864.
U.S. Notice of Allowance dated Mar. 9, 2018 issued in U.S. Appl. No. 15/609,864.
U.S. Notice of Allowance dated Apr. 9, 2018 issued in U.S. Appl. No. 15/201,221.
U.S. Notice of Allowance dated Mar. 26, 2018 issued in U.S. Appl. No. 15/253,301.
U.S. Office Action dated Jan. 26, 2018 issued in U.S. Appl. No. 15/683,397.
U.S. Final Office Action dated Nov. 16, 2018 issued in U.S. Appl. No. 15/683,397.
Korean Office Action, dated Nov. 27, 2017, issued in Application No. KR 10-2013-7010291.
Korean Decision for Grant of Patent, dated Jul. 25, 2018, issued in Application No. KR 10-2013-7010291.
Taiwan Office Action dated Oct. 19, 2017 issued in Application No. TW 105130207.
Korean First Office Action dated Oct. 2, 2018 issued in Application No. KR 10-2014-7010949.
Taiwan First Office Action dated Mar. 14, 2018 issued in Application No. TW 106122777.
Korean Second Office Action dated Sep. 20, 2018 issued in Application No. KR 10-2014-7008696.
Chinese Fourt Office Action dated May 16, 2018 issued in Application No. CN 201310021460.8.
European Examination Report dated Dec. 11, 2017 issued in Application No. EP 13 15 2046.
Japanese Decision of Rejection dated Jan. 9, 2018 issued in Application No. JP 2013-007612.
Japanese Decision of Refusal dated Dec. 5, 2017 issued in Application No. JP2014-554825.
Japanese Notice of Reason for Refusal dated Jul. 24, 2018 issued in Application No. JP 2017-159931.
Japanese First Office Action dated Oct. 31, 2017 issued in Application No. JP 2013-230782.

(56) References Cited

OTHER PUBLICATIONS

Japanese Second Office Action dated May 22, 2018 issued in Application No. JP 2013-230782.
Japanese Decision to Grant dated Sep. 10, 2018 issued in Application No. JP 2013-230782.
Japanese Office Action dated Dec. 5, 2017 issued in Application No. JP 2013-231188.
Taiwan First Office Action [No Translation] dated Sep. 20, 2018 issued in Application No. TW 106140906.
Taiwan First Office Action dated May 3, 2018 issued in Application No. TW 103133765.
Taiwan First Office Action dated Jun. 26, 2018 issued in Application No. TW 103145386.
Chinese Second Office Action dated Mar. 26, 2018 issued in Application No. CN 201510091775.9.
Chinese Third Office Action dated Oct. 15, 2018 issued in Application No. CN 201510091775.9.
Taiwanese First Office Action dated Sep. 14, 2018 issued in Application No. TW 104106165.
Taiwan Notice of Allowance and Search Report dated Aug. 30, 2018 issued in Application No. TW 104104471.
Taiwan First Office Action dated Sep. 13, 2018, issued in Application No. TW 104104648.
Chinese Third Office Action dated Dec. 22, 2017, issued in Application No. CN 201380006994.1.
Taiwanese First Office Action [No Translation] dated Nov. 9, 2018 issued in Application No. TW 104122669.
Chinese First Office Action dated Mar. 30, 2018 issued in Application No. CN 201610206201.
Chinese First Office Action dated Oct. 8, 2018 issued in Application No. CN 201710522311.8.
Elam et al.,(2003) "Growth of ZnO/Al2O3 Alloy Films Using Atomic Layer Deposition Techniques," Chemistry of Materials, 2003, vol. 15, No. 4, pp. 1020-1028. <doi:10.1021/cm020607+>.
U.S. Notice of Allowance dated Jul. 26, 2018 issued in U.S. Appl. No. 15/829,702.
U.S. Notice of Allowance dated Apr. 25, 2018 issued in U.S. Appl. No. 15/253,546.
U.S. Final Office Action dated Apr. 9, 2018 issued in U.S. Appl. No. 15/279,312.
U.S. Final Office Action dated Jan. 2, 2018 issued in U.S. Appl. No. 15/351,221.
U.S. Notice of Allowance dated Jul. 16, 2018 issued in U.S. Appl. No. 15/351,221.
U.S. Final Office Action dated Jan. 18, 2018 issued in U.S. Appl. No. 15/349,746.
U.S. Office Action dated Jun. 29, 2018 issued in U.S. Appl. No. 15/349,746.
U.S. Final Office Action dated Apr. 20, 2018 issued in U.S. Appl. No. 15/349,753.
U.S. Office Action dated Sep. 28, 2018 issued in U.S. Appl. No. 15/349,753.
Chinese First Office Action dated Nov. 8, 2017 issued in Application No. CN 201510615853.0.
PCT International Search Report and Written Opinion dated Feb. 13, 2018 issued in Application No. PCT/US2017/060692.
PCT International Search Report and Written Opinion dated Feb. 21, 2018 issued in Application No. PCT/US2017/060240.

\* cited by examiner

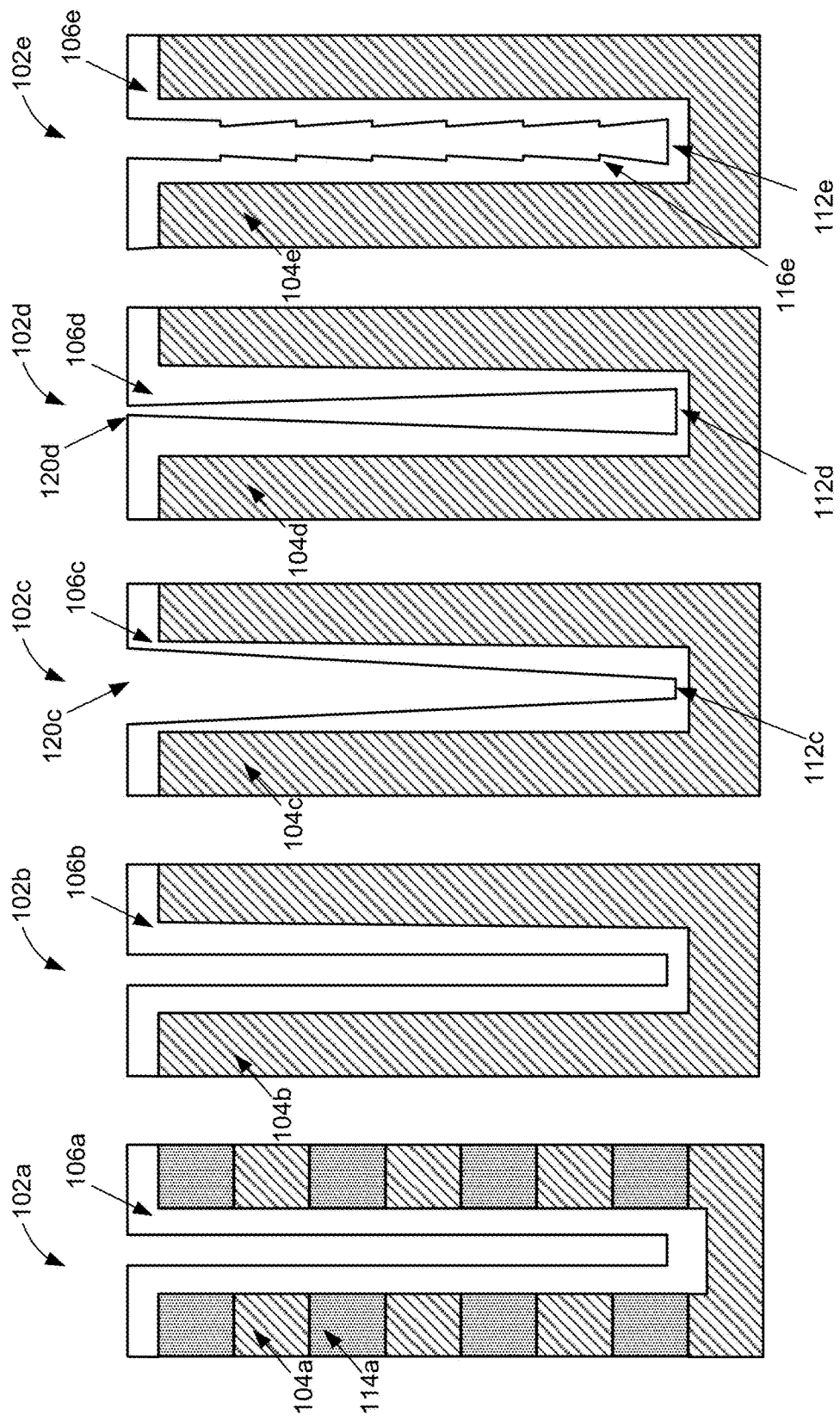

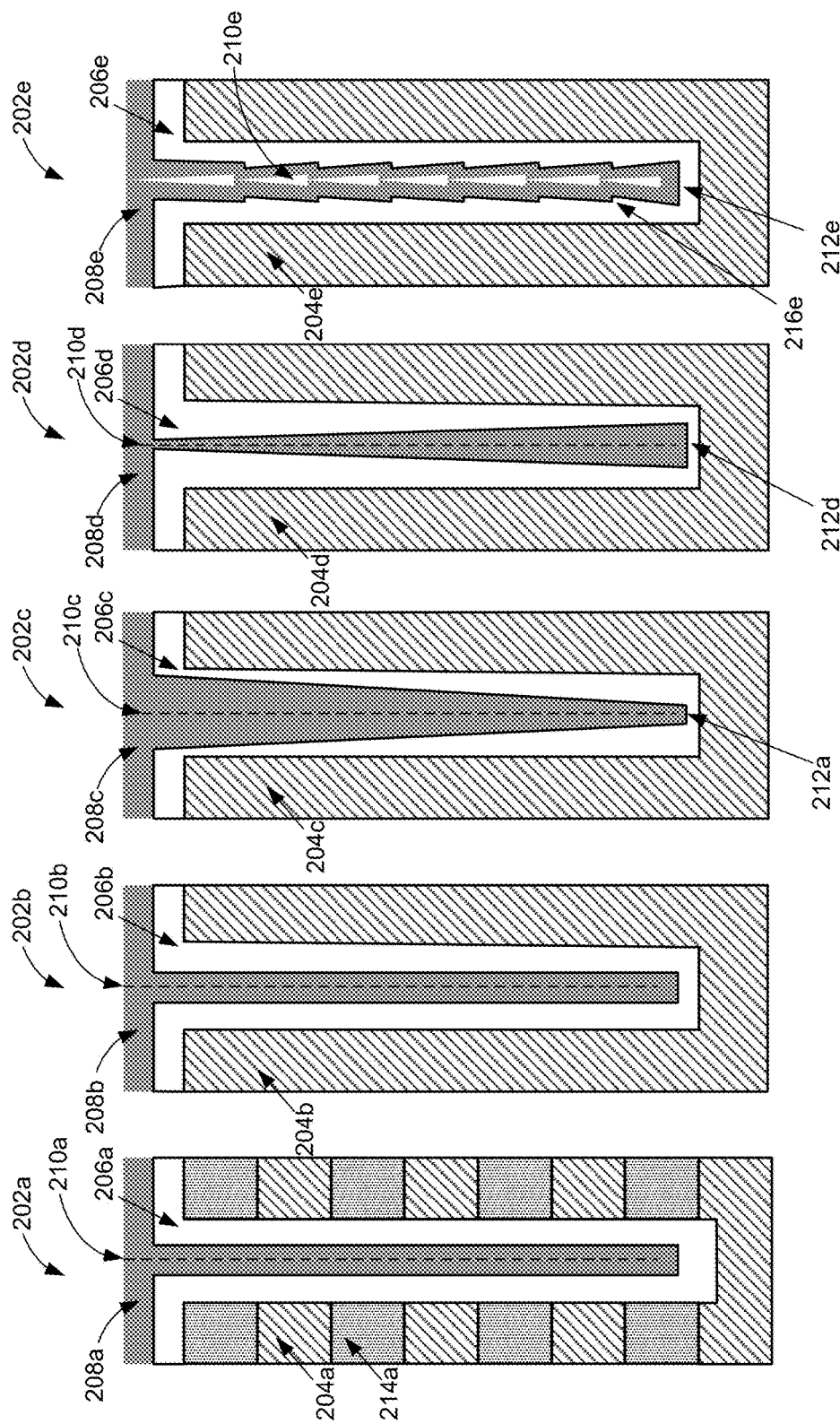

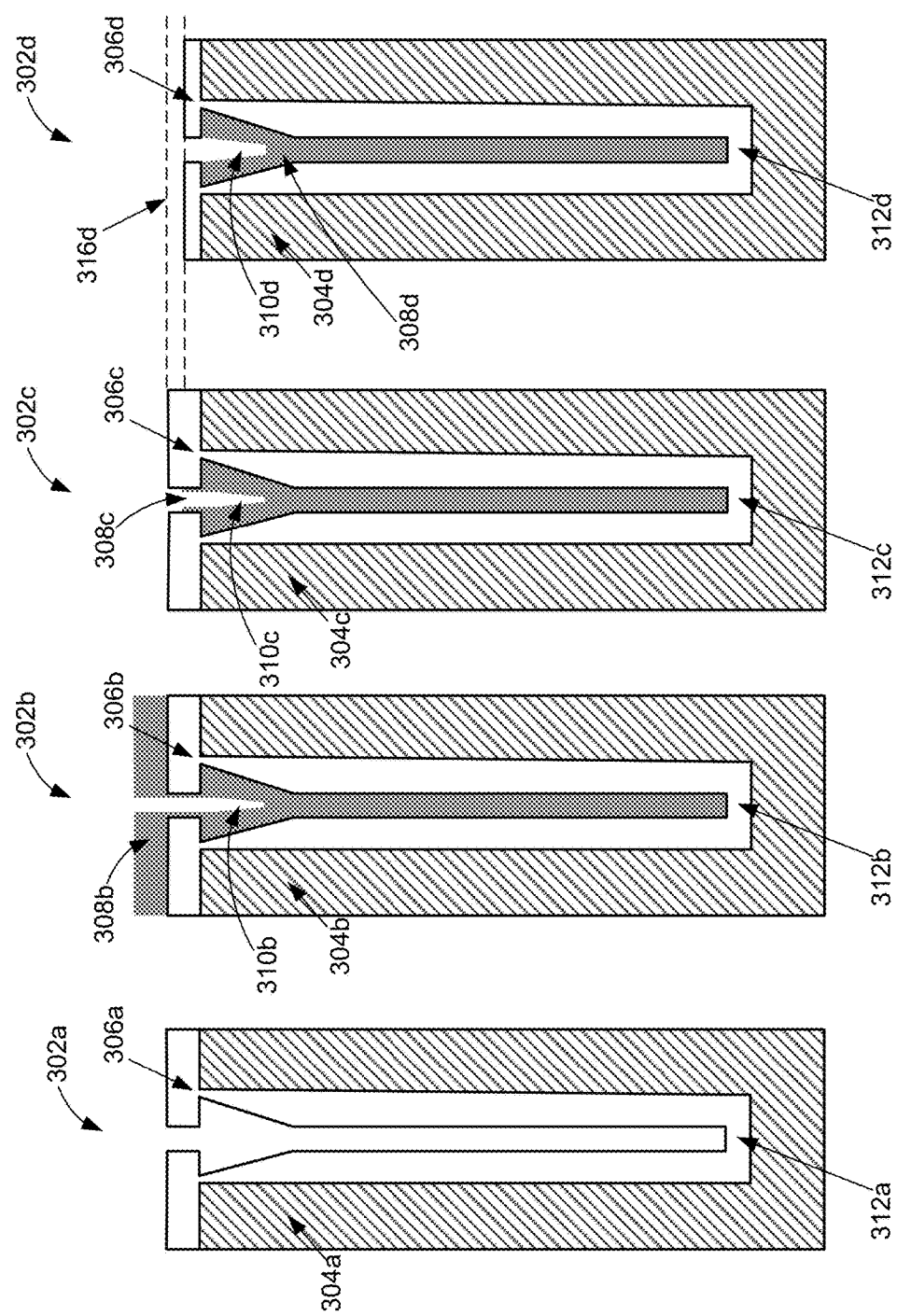

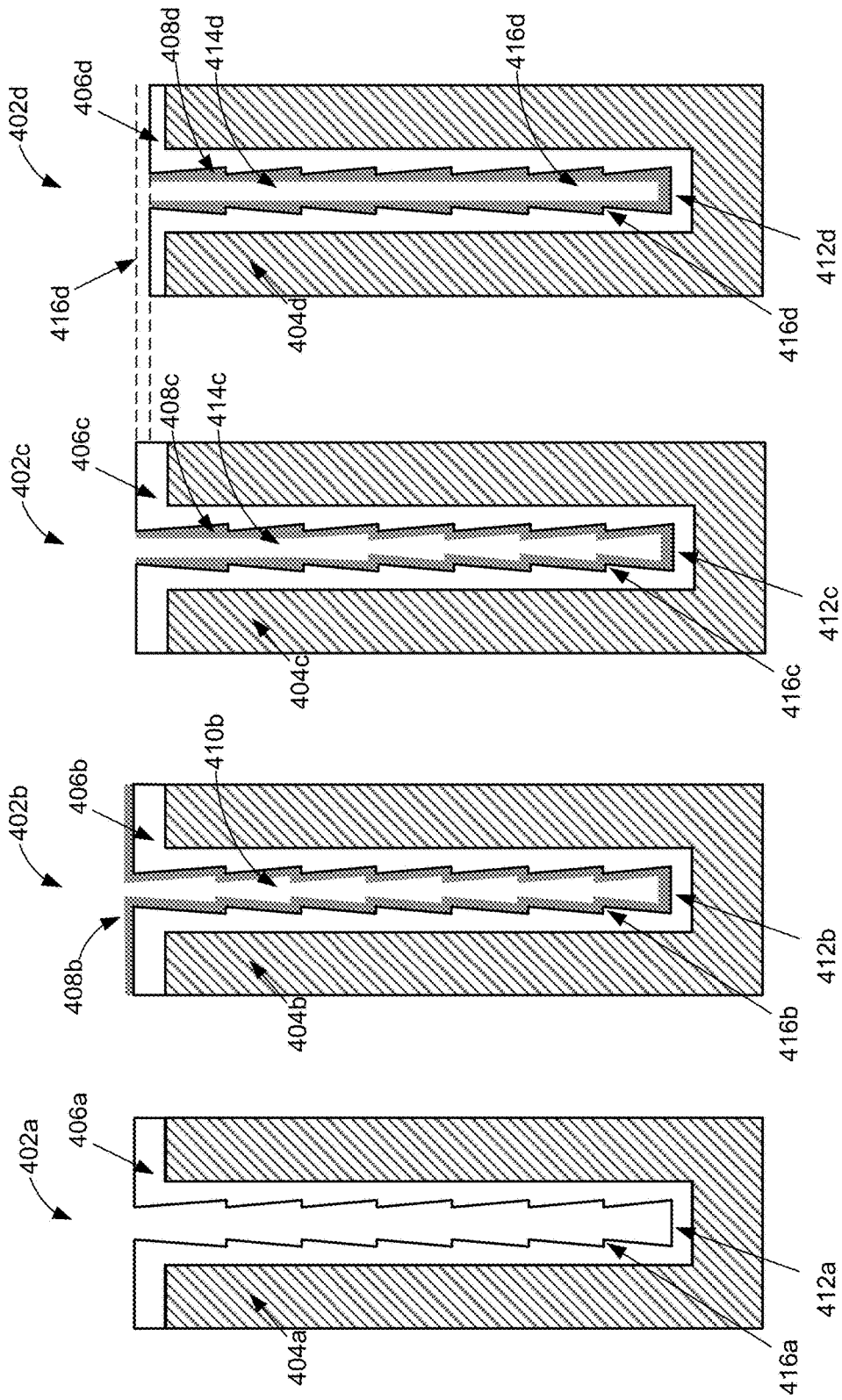

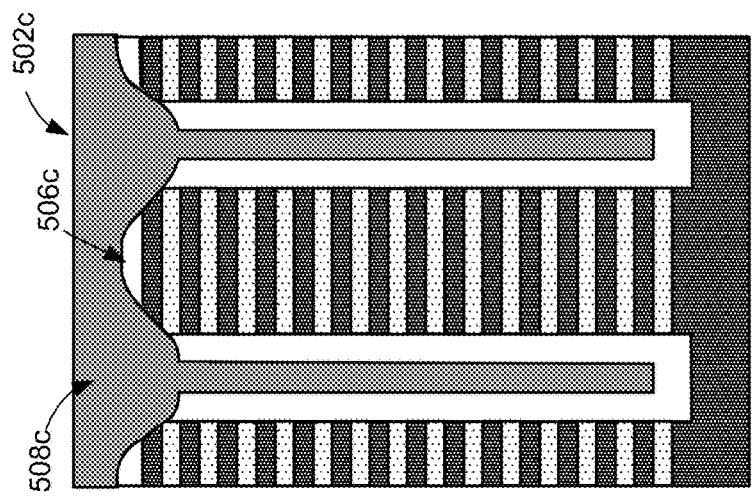
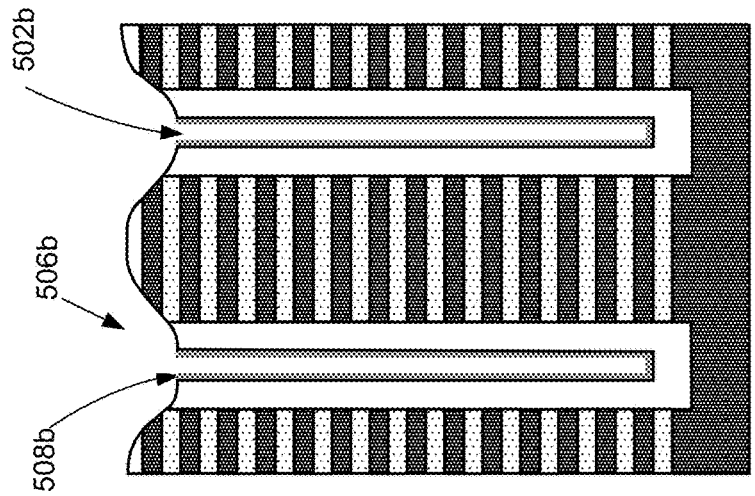
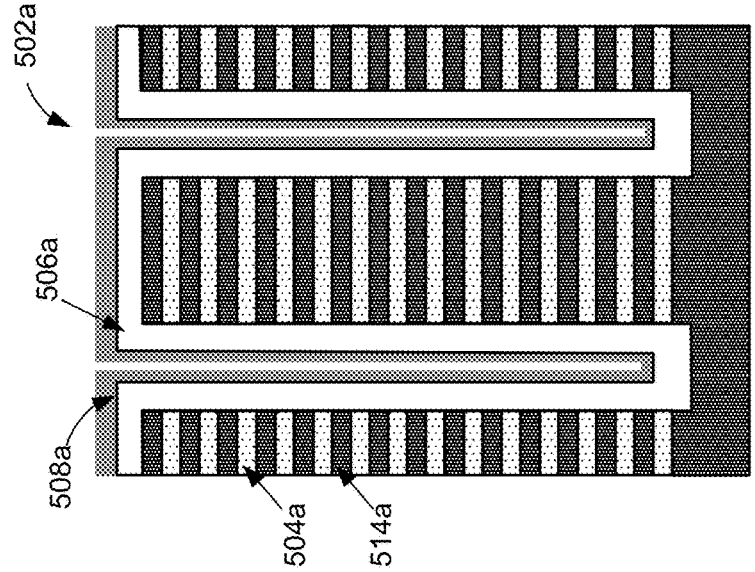
FIG. 5C
FIG. 5B
FIG. 5A

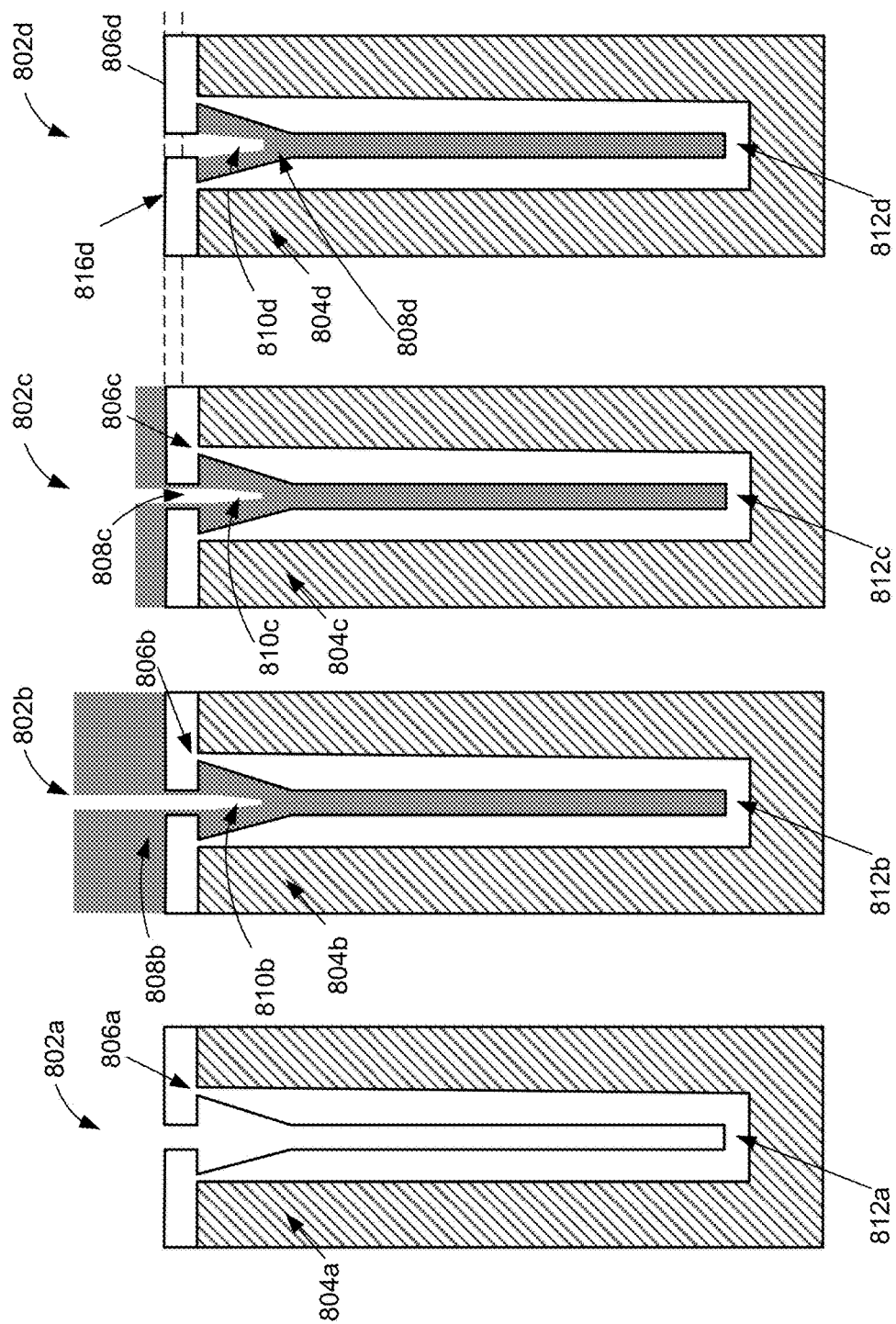

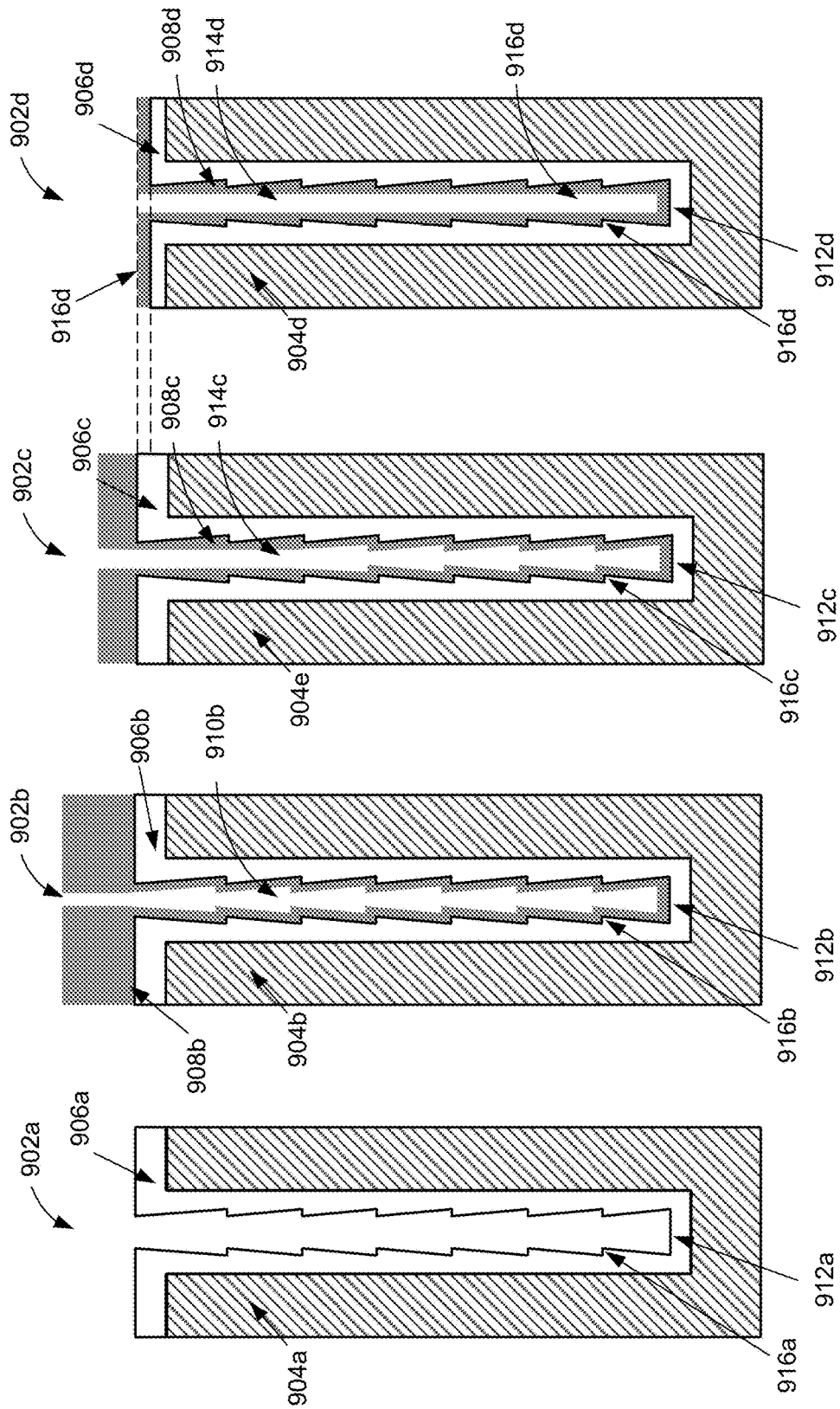

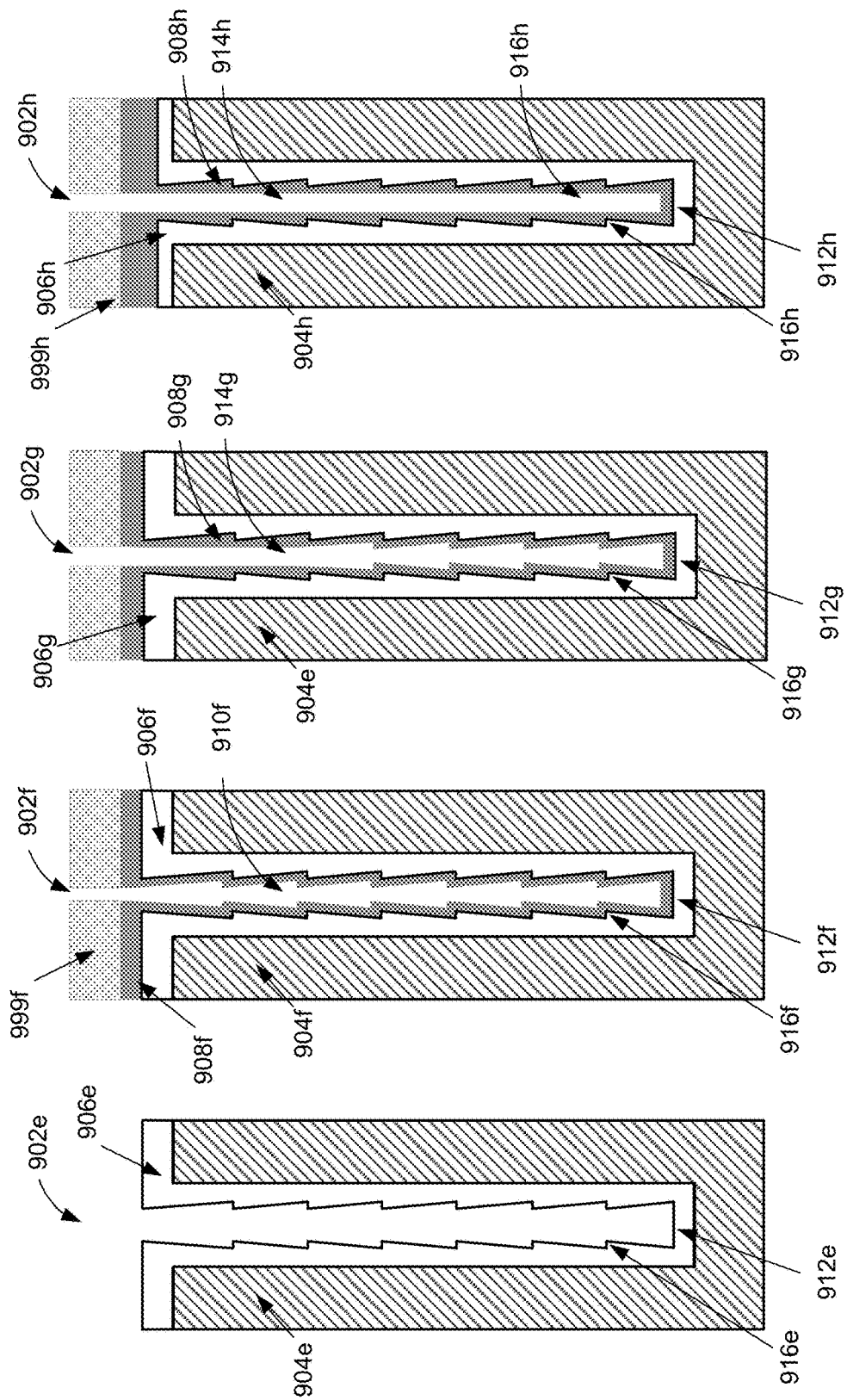

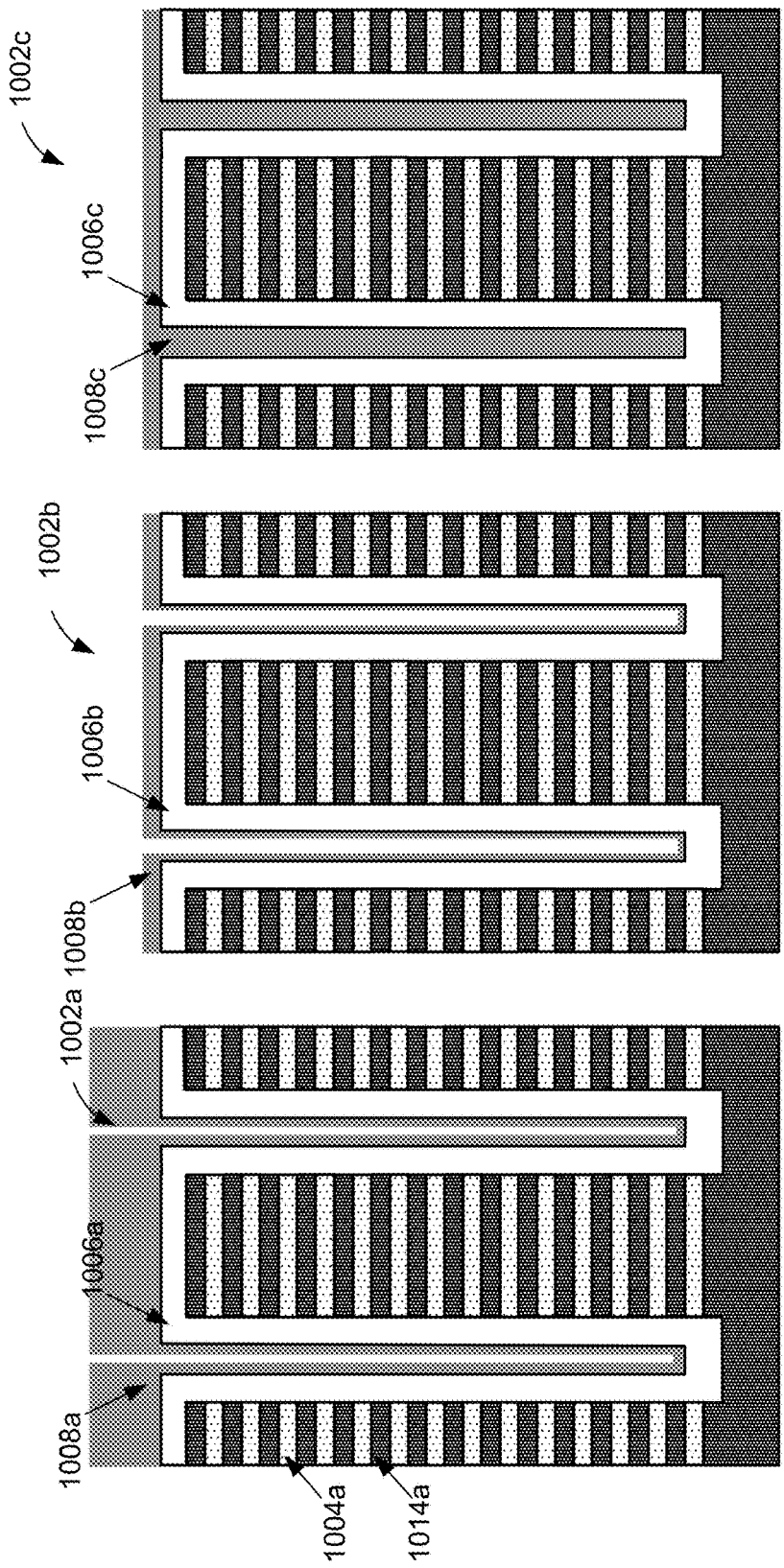

DIELECTRIC GAPFILL OF HIGH ASPECT RATIO FEATURES UTILIZING A SACRIFICIAL ETCH CAP LAYER

BACKGROUND

Semiconductor fabrication processes involve patterning operations, including depositing and etching of various materials on a semiconductor substrate. Substrates include features of various types, including horizontal and vertical features, negative features with sloped sidewalls, features with re-entrant features, and features made as negative features in substrates having a multi-layered stack of two or more materials such that the composition of the material on the surface of sidewalls of the feature varies depending on the depth of the feature. Various techniques for filling such features exist, but as devices shrink and features become smaller, feature fill without voids or seams becomes increasingly challenging.

SUMMARY

Methods and apparatuses for processing semiconductor substrates are provided herein. One aspect involves a method of filling a feature on a substrate, the method including: providing the substrate including the feature to a process chamber, the feature including a feature opening and sidewall topography, the sidewall topography including stubs on the sidewall of the feature; depositing a first amount of silicon oxide for a duration insufficient to fill the feature using a silicon-containing precursor and an oxidant; exposing the first amount of the silicon oxide to an etchant to etch at least some of the first amount of the silicon oxide; and after etching the first amount of the silicon oxide, depositing a second amount of the silicon oxide over the etched first amount of the silicon oxide.

In various embodiments, the stubs have a dimension perpendicular to a planar surface of the sidewall of between 100 Å and about 300 Å.

In various embodiments, the duration insufficient to deposit the first amount of silicon oxide into the feature forms an overburden of silicon oxide on a field surface of the substrate. In some embodiments, exposing the first amount of the silicon oxide to the etchant includes etching the at least some of the first amount of the silicon oxide at or near the feature opening relative to the inside of the feature.

In various embodiments, the second amount of the silicon oxide is deposited by plasma-enhanced chemical vapor deposition. In some embodiments, the method may also include, after depositing the second amount of the silicon oxide, exposing the second amount of the silicon oxide to the etchant for a duration longer than the duration used for exposing the first amount of the silicon oxide to the etchant.

In some embodiments, the sidewalls of the feature include two or more materials layered in a stack.

In various embodiments, the depositing of the first amount of the silicon oxide and the exposing of the first amount of the silicon oxide to the etchant are performed without breaking vacuum. In various embodiments, the depositing of the first amount of the silicon oxide and the exposing of the first amount of the silicon oxide to the etchant are performed in the same chamber.

In some embodiments, the exposing of the first amount of the silicon oxide to the etchant and the depositing of the second amount of the silicon oxide are performed without breaking vacuum. In some embodiments, the exposing of the first amount of the silicon oxide to the etchant and the depositing of the second amount of the silicon oxide are performed in the same chamber.

In various embodiments, the depositing of the first amount of the silicon oxide, the exposing of the first amount of the silicon oxide to the etchant, and the depositing of the second amount of the silicon oxide are performed without breaking vacuum. In various embodiments, the depositing of the first amount of the silicon oxide, the exposing of the first amount of the silicon oxide to the etchant, and the depositing of the second amount of the silicon oxide are performed in the same chamber.

In various embodiments, the first amount of the silicon oxide is deposited by one or more cycles of atomic layer deposition, each cycle of one or more cycles of the atomic layer deposition including alternating pulses of the oxidant and the silicon-containing precursor. In various embodiments, the duration insufficient to fill the feature is the duration for performing about 40 cycles or less of the atomic layer deposition. In some embodiments, a plasma is ignited during the pulses of the oxidant. In various embodiments, each cycle of one or more cycles of the atomic layer deposition further includes purging the process chamber between the alternating pulses of the oxidant and the silicon-containing precursor. In some embodiments, the process chamber is purged after depositing the first amount of silicon oxide and before exposing the first amount of the silicon oxide to the etchant. In some embodiments, the process chamber is purged after exposing the first amount of the silicon oxide to the etchant and before depositing the second amount of the silicon oxide.

In various embodiments, the etchant is any one of nitrogen trifluoride ($NF_3$), fluoroform ($CHF_3$), octafluorocyclobutane ($C_4F_8$), tetrafluoromethane ($CF_4$), and combinations thereof.

In various embodiments, the feature has a depth of at least 5 microns. In various embodiments, the feature has an aspect ratio of at least 15:1.

A method of filling a feature on a substrate, the method including: providing the substrate including the feature to a process chamber, the feature including a feature opening and sidewall topography, the sidewall topography including stubs on the sidewall of the feature; depositing a first amount of silicon oxide for a duration insufficient to fill the feature using a silicon-containing precursor and an oxidant; after depositing the first amount of silicon oxide and prior to exposing the first amount of silicon oxide to an etchant, depositing a sacrificial helmet forming an overburden on a field surface of the substrate; exposing the substrate to the etchant to etch at least some of the first amount of the silicon oxide; and after etching the first amount of the silicon oxide, depositing a second amount of the silicon oxide over the etched first amount of the silicon oxide to at least partially fill the feature.

In various embodiments, the stubs have a dimension perpendicular to a planar surface of the sidewall of between 100 Å and about 300 Å.

In various embodiments, the sacrificial helmet is deposited by plasma enhanced chemical vapor deposition.

In various embodiments, the sacrificial helmet includes silicon nitride.

In various embodiments, the sacrificial helmet includes silicon oxide.

In various embodiments, the depositing of the first amount of the silicon oxide and the depositing of the sacrificial helmet are performed without breaking vacuum. In some embodiments, the depositing of the first amount of the silicon oxide and the exposing of the substrate to the etchant are performed without breaking vacuum. In some embodiments, the depositing of the first amount of the silicon oxide, the depositing of the sacrificial helmet, and the exposing of the substrate to the etchant are performed without breaking vacuum. In some embodiments, the exposing of the substrate to the etchant and the depositing of the second amount of the silicon oxide are performed without breaking vacuum. In some embodiments, the depositing of the sacrificial helmet, the exposing of the substrate to the etchant and the depositing of the second amount of the silicon oxide are performed without breaking vacuum. In some embodiments, the depositing of the first amount of the silicon oxide, the depositing of the sacrificial helmet, the exposing of the substrate to the etchant and the depositing of the second amount of the silicon oxide are performed without breaking vacuum.

In various embodiments, the depositing of the first amount of the silicon oxide and the depositing of the sacrificial helmet are performed in the same chamber. In some embodiments, the depositing of the first amount of the silicon oxide and the exposing of the substrate to the etchant are performed in the same chamber. In some embodiments, the depositing of the first amount of the silicon oxide, the depositing of the sacrificial helmet, and the exposing of the substrate to the etchant are performed in the same chamber. In some embodiments, the depositing of the sacrificial helmet, the exposing of the substrate to the etchant and the depositing of the second amount of the silicon oxide are performed in the same chamber. In some embodiments, the depositing of the first amount of the silicon oxide, the depositing of the sacrificial helmet, the exposing of the substrate to the etchant and the depositing of the second amount of the silicon oxide are performed in the same chamber.

In various embodiments, the first amount of the silicon oxide is deposited by one or more cycles of atomic layer deposition, each cycle of one or more cycles of the atomic layer deposition including alternating pulses of the oxidant and the silicon-containing precursor. In various embodiments, the duration insufficient to fill the feature is the duration for performing about 40 cycles or less of the atomic layer deposition. In some embodiments, a plasma is ignited during the pulses of the oxidant. In various embodiments, each cycle of one or more cycles of the atomic layer deposition further includes purging the process chamber between the alternating pulses of the oxidant and the silicon-containing precursor. In some embodiments, the process chamber is purged after depositing the first amount of silicon oxide and before exposing the first amount of the silicon oxide to the etchant. In some embodiments, the process chamber is purged after exposing the first amount of the silicon oxide to the etchant and before depositing the sacrificial helmet.

In various embodiments, the etchant is any one of nitrogen trifluoride ($NF_3$), fluoroform ($CHF_3$), octafluorocyclobutane ($C_4F_8$), tetrafluoromethane ($CF_4$), and combinations thereof.

In various embodiments, the feature has a depth of at least 5 microns. In various embodiments, the feature has an aspect ratio of at least 15:1.

Another aspect involves a method of filling a feature on a substrate, the method including: providing the substrate including the feature to a process chamber, the feature including a feature opening and sidewalls having one or more reentrant surfaces; depositing a first amount of a material for a duration insufficient to fill the feature; exposing the first amount of the material to an etchant to etch at least some of the first amount of the material within the feature; and after etching the first amount of the material, depositing a second amount of the material over the etched first amount of the material, whereby the material is any of silicon carbide, silicon nitride, silicon, tungsten, ruthenium, copper, cobalt, and molybdenum.

In various embodiments, the duration sufficient to deposit the first amount of silicon oxide into the feature forms an overburden of silicon oxide on a field surface of the substrate.

In various embodiments, exposing the first amount of the silicon oxide to the etchant includes etching the at least some of the first amount of the silicon oxide at or near the feature opening relative to the inside of the feature.

In various embodiments, the second amount of the silicon oxide is deposited by plasma-enhanced chemical vapor deposition.

In some embodiments, the method also includes, after depositing the second amount of the silicon oxide, exposing the second amount of the silicon oxide to the etchant for a duration longer than the duration used for exposing the first amount of the silicon oxide to the etchant.

In various embodiments, the sidewalls of the feature include two or more materials layered in a stack.

In various embodiments, depositing of the first amount of the silicon oxide and the exposing of the first amount of the silicon oxide to the etchant are performed without breaking vacuum.

In various embodiments, the exposing of the first amount of the silicon oxide to the etchant and the depositing of the second amount of the silicon oxide are performed without breaking vacuum.

Another aspect involves a method of filling a feature on a substrate, the method including: providing the substrate including the feature to a process chamber, the feature including a feature opening and sidewall topography, the sidewall topography including stubs on the sidewall of the feature; depositing a first amount of a first material for a duration insufficient to fill the feature; after depositing the first amount of a first material and prior to exposing the first amount of the first material to an etchant, depositing a sacrificial helmet forming an overburden on a field surface of the substrate, the sacrificial helmet including a second material; exposing the substrate to the etchant to etch at least some of the first amount of the first material; and after etching the first amount of the first material, depositing a second amount of the oxide over the etched first amount of the first material to at least partially fill the feature.

In various embodiments, the stubs have a dimension perpendicular to a planar surface of the sidewall of between 100 Å and about 300 Å.

In various embodiments, the first material is different from the second material. In various embodiments, the first material is compositionally the same as the second material. In various embodiments, the second material is deposited by plasma enhanced chemical vapor deposition.

In various embodiments, the first material is deposited by atomic layer deposition. In some embodiments, the second material is deposited by introducing a silicon-containing precursor and a nitrogen-containing reactant simultaneously while igniting a plasma to form silicon nitride. In various embodiments, the nitrogen-containing reactant is introduced with oxygen. In some embodiments, the etchant is a halogen-containing etchant. For example, in some embodiments, the etchant is nitrogen trifluoride. In various embodiments, the sacrificial helmet has etch selectivity relative to the first material when using the etchant. In some embodiments, the etch selectivity of sacrificial helmet to the first material is between about 1:2 and about 1:5, where the first material etches about 2 to about 5 times faster than the sacrificial helmet.

Another aspect involves an apparatus for processing a semiconductor substrate, the apparatus including: (a) at least one process chamber, the at least one process chamber including a pedestal for holding the semiconductor substrate; (b) at least one outlet for coupling to a vacuum; (c) one or more process gas inlets coupled to one or more process gas sources; and (d) a controller for controlling operations in the apparatus, including machine-readable instructions for: (i) introducing a silicon-containing precursor and an oxidant to deposit a first amount of silicon oxide on the semiconductor substrate for a duration insufficient to fill a feature on the semiconductor substrate, the feature having a feature opening and sidewall topography, the sidewall topography having stubs on the sidewall of the feature; (ii) introducing an etchant to the at least one process chamber for a duration to etch at least some of the first amount of the silicon oxide; and (iii) after introducing the etchant to the at least one process chamber, introducing the silicon-containing precursor and the oxidant to deposit a second amount of silicon oxide over the etched first amount of the silicon oxide.

In various embodiments, the controller further includes instructions for setting the duration of (iii) to be longer than the duration of (i). In various embodiments, the controller further includes machine-readable instructions for performing (i) and (ii) without breaking vacuum.

In various embodiments, the apparatus also includes a plasma generator for generating a plasma. In some embodiments, the controller further includes instructions for igniting the plasma when introducing the oxidant.

Another aspect involves an apparatus for processing a semiconductor substrate, the apparatus including: (a) at least one process chamber, the at least one process chamber including a pedestal for holding the semiconductor substrate; (b) at least one outlet for coupling to a vacuum; (c) one or more process gas inlets coupled to one or more process gas sources; and (d) a controller for controlling operations in the apparatus, including machine-readable instructions for: (i) introducing a deposition precursor and reactant for depositing a first amount of a material for a duration insufficient to fill a feature on the semiconductor substrate; (ii) introducing an etchant to etch at least some of the first amount of the material in the feature; and (iii) after introducing the etchant, introducing the deposition precursor and the reactant to deposit a second amount of the material over the etched first amount of the material, whereby the material is any one of silicon carbide, silicon nitride, silicon, tungsten, ruthenium, copper, cobalt, and molybdenum.

In various embodiments, the controller further includes instructions for setting the duration of (iii) to be longer than the duration of (i). In various embodiments, the controller further includes machine-readable instructions for performing (i) and (ii) without breaking vacuum.

In various embodiments, the apparatus also includes a plasma generator for generating a plasma. In some embodiments, the controller further includes instructions for igniting the plasma when introducing the oxidant.

Another aspect involves an apparatus for processing a semiconductor substrate, the apparatus including: (a) at least one process chamber, the at least one process chamber including a pedestal for holding the semiconductor substrate; (b) at least one outlet for coupling to a vacuum; (c) one or more process gas inlets coupled to one or more process gas sources; and (d) a controller for controlling operations in the apparatus, including machine-readable instructions for: (i) introducing a silicon-containing precursor and an oxidant to deposit a first amount of silicon oxide on the semiconductor substrate for a duration insufficient to fill a feature on the semiconductor substrate, the feature having a feature opening and sidewall topography, the sidewall topography having stubs on the sidewall of the feature; (ii) introducing one or more process gases for depositing a sacrificial helmet forming an overburden on a field surface of the semiconductor substrate; (iii) introducing an etchant to the at least one process chamber for a duration to etch at least some of the first amount of the silicon oxide; and (iv) after introducing the etchant to the at least one process chamber, introducing the silicon-containing precursor and the oxidant to deposit a second amount of silicon oxide over the etched first amount of the silicon oxide.

In various embodiments, the controller includes instructions for delivering a second silicon-containing precursor and a nitrogen-containing reactant during (ii) to deposit the sacrificial helmet, the sacrificial helmet including silicon nitride.

Another aspect involves an apparatus for processing a semiconductor substrate, the apparatus including: (a) at least one process chamber, the at least one process chamber including a pedestal for holding the semiconductor substrate; (b) at least one outlet for coupling to a vacuum; (c) one or more process gas inlets coupled to one or more process gas sources; and (d) a controller for controlling operations in the apparatus, including machine-readable instructions for: (i) introducing a first set of deposition precursors for depositing a first material to deposit a first amount of the first material on the semiconductor substrate for a duration insufficient to fill a feature on the semiconductor substrate; (ii) introducing one or more process gases for depositing a sacrificial helmet forming an overburden on a field surface of the semiconductor substrate, the sacrificial helmet including a second material; (iii) introducing an etchant to the at least one process chamber for a duration to etch at least some of the first amount of the first material; and (iv) after introducing the etchant to the at least one process chamber, introducing first set of deposition precursors to deposit a second amount of the first material over the etched first amount of the first material.

In various embodiments, the first material is different from the second material. In various embodiments, the first material is compositionally the same as the second material.

These and other aspects are described further below with reference to the drawings.

BRIEF DESCRIPTION OF THE DRAWINGS

FIGS. 1A-1E are schematic illustrations of example substrates with features of various types.

FIGS. 2A-2E are schematic illustrations of example substrates with features of various types filled with material.

FIGS. 3A-3D are schematic illustrations of an example feature in a substrate with a re-entrant feature undergoing feature fill.

FIGS. 4A-4D are schematic illustrations of an example feature in a substrate with sidewall oscillations undergoing feature fill.

FIGS. 5A-5C are schematic illustrations of an example feature in a substrate with a multi-layer stack undergoing feature fill.

FIGS. 8A-8D are schematic illustrations of an example feature in a substrate with a re-entrant feature undergoing feature fill in accordance with certain disclosed embodiments.

FIGS. 9A-9D are schematic illustrations of an example feature in a substrate with sidewall topography undergoing feature fill in accordance with certain disclosed embodiments.

FIGS. 9E-9H are schematic illustrations of an example feature in a substrate with sidewall topography undergoing feature fill in accordance with certain disclosed embodiments.

FIGS. 10A-10C are schematic illustrations of an example feature in a substrate with a multi-layer stack undergoing feature fill in accordance with certain disclosed embodiments.

DETAILED DESCRIPTION

Figure 6:
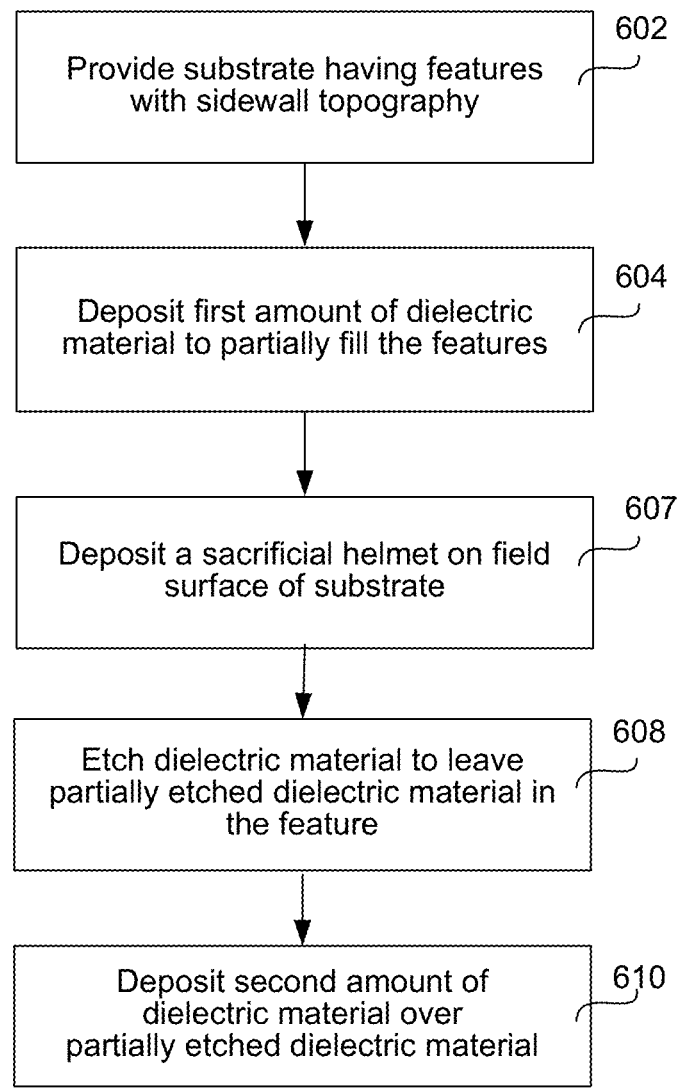
FIGS. 6 and 7 are process flow diagrams depicting operations performed in methods performed in accordance with certain disclosed embodiments.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor fabrication processes often include dielectric gap fill using chemical vapor deposition (CVD) and/or atomic layer deposition (ALD) methods to fill features. Described herein are methods of filling features with material, such as dielectric or metal material, including but not limited to silicon oxide, and related systems and apparatuses. The methods described herein can be used to fill vertical negative features. Features formed in a substrate can be characterized by one or more of narrow and/or re-entrant openings, constrictions within the feature, and high aspect ratios. The substrate may be a silicon wafer, e.g., a 200-mm wafer, a 300-mm wafer, or a 450-mm wafer, including wafers having one or more layers of material such as dielectric, conducting, or semi-conducting material deposited thereon.

A feature may be formed in one or more of these layers. For example, a feature may be formed at least partially in a dielectric layer. A single substrate as described herein includes multi-laminate stack having two or more materials, such a ONON (oxide-nitride-oxide-nitride) stack, a OPOP (silicon oxide on polysilicon) stack, or OMOM stack (silicon oxide on metal such as tungsten, cobalt, or molybdenum) and features may be formed in such multi-layer substrates where sidewalls of the features include two or more compositions. Multi-laminate stacks may range from a bilayer (such as ON) to 500 combined layers (such as $\{ON\}_{150}$). Features may also have sloped sidewalls or sidewall topography. Sidewall topography include jagged sidewalls having one or more stubs, each stub having a dimension perpendicular to a planar surface of the sidewall of between 100 Å and about 300 Å. In various embodiments, sidewall topography is characterized by two or more stubs where the two or more stubs are present on the sidewalls of a feature depth wise. That is, one stub on the sidewall is at a depth different than the depth at which the second stub is present on the sidewall. Additionally, features may also include a re-entrant profile.

A feature hole may also have a dimension near the opening, e.g., an opening diameter or line width, of between about 1 nm to about 1 micron, for example between about 25 nm to about 300 nm, such as about 200 nm. A feature hole can be referred to as an unfilled feature or simply a feature. In some implementations, a feature hole may have an aspect ratio of at least about 2:1, at least about 4:1, at least about 6:1, or at least about 20:1, or greater.

FIGS. 1A-1E show example substrates with features of various types. FIG. 1A shows feature 102a in a substrate having a multi-layer stack includes two compositions 104a and 114a in alternating horizontal layers, where feature 102a is defined by etching a hole into liner 106a. Note that while a liner 106a is depicted in various examples described herein, in some embodiments a liner is not present. Where a liner is present, the liner may be a nitride material, such as but not limited to silicon nitride, or in some embodiments, the liner may be a poly-silicon material.

FIG. 1B shows a feature 102b in a substrate 104b having straight sidewalls defined by liner 106b. Feature 102b of FIG. 1B has a high aspect ratio with straight sidewalls. FIG. 1C shows an example feature 102c in substrate 104c with liner 106c thereby forming feature 102c with positively sloped sidewalls where the feature opening 120c at the top of the feature 102c is greater than the width at the bottom 112c. FIG. 1D shows a feature 102d in a substrate 104d where the feature 102d is defined by etching a hole in liner 106d, and the feature 102d includes negatively sloped sidewalls, or a re-entrant profile, where the feature opening 120d at the top of the feature 102d is narrower than the width of the bottom 112d of the feature 102d. FIG. 1E shows a feature 102e in a substrate 104e where the feature 102e is defined by etching a hole in liner 106e, and the feature 102e includes a sidewall topography having stubs. In some cases, a feature can have sidewall topography due to the type of etching performed to form the feature, or the one or more materials in which the feature is formed. Gapfill of features such as these examples shown in FIGS. 1A-1E is dependent on the feature type and profile. While existing techniques such as CVD and ALD may be used to fill such features, conventional techniques result in formation of undesirable seams or voids within the feature.

FIG. 2A shows an example feature 202a with liner 206a in a substrate including a multi-layer stack having material 204a and 214a in alternating layers. Dielectric material 208a is deposited into the feature 202a by conformal ALD, but a seam 210a forms in the middle of the feature 202a because dielectric material 208a growth from the sidewalls meets in the middle of the feature 202a, thereby forming the seam 210a.

FIG. 2B shows a similar phenomenon for feature 202b filled with dielectric material 208b by ALD over liner 206b defining the feature 202b having straight sidewalls in substrate 204b. Likewise, in FIG. 2C, the positively sloped feature 202c including a narrower width at the bottom 212a in substrate 204c with sidewalls defined by liner 206c also results in formation of seam 210c when dielectric material 208c is deposited by conformal ALD. FIG. 2D also shows a feature 202d having negatively sloped features with a wider width at the bottom 212d defined by liner 206d in substrate 204d. In this example, a seam 210d is still formed when dielectric material 208d is deposited. In some cases, a void may also form at or near the bottom of the feature 202d due to the conformal fill by ALD. FIG. 2E shows an example of feature 202e having sidewall topography defined by liner 206e in substrate 204e. The sidewall topography is characterized by stubs 216e, and the bottom of the feature 212e is wider than the width at the stubs 216e. When material 208e is deposited by ALD, microvoids 210e form and the feature is unable to be filled completely. Microvoids may be defined as voids being less than about 50 nm in diameter, or in some embodiments between about 30 nm and about 50 nm in diameter, or less than 30 nm in diameter, such as less than about 15 nm wide.

Some dep-etch-dep (deposition, etch, deposition) techniques have been posited to fill various features with dielectric material. However, existing dep-etch-dep techniques also cause undesirable etching of other material on the substrate, thereby resulting in material loss. Examples are provided in FIGS. 3A-3D, 4A-4D, and 5A-5C as described below.

FIG. 3A shows an example of a feature 302a in substrate 304a where the feature profile is defined by liner 306a. As shown, the bottom of the feature depicted at 312a has a narrower width than a portion of the width at or near the feature opening, for which a re-entrant profile is depicted. In conventional conformal ALD, material 308b fills the feature 302b layer by layer as shown in FIG. 3B. In FIG. 3B, material 308b is depicted as being deposited into feature 302b, the feature profile of which is defined in liner 306b of substrate 304b. However, ALD deposition is conformal and results in the formation of void 310b, while the bottom of the feature 312b is completely filled. Conventional dep-etch-dep involves etching after deposition of ALD, such as shown in FIG. 3C. In FIG. 3C, the deposited dielectric material 308c is etched back to open the narrow feature opening of feature 302c in substrate 304c. However, even after the dielectric material 308c is etched to the surface of liner 306c, void 310c still remains while the opening 308c is not yet open. The bottom of the feature 312c remains filled. In conventional dep-etch-dep, etch is performed until the feature is opened to allow further fill of the feature, and thus as shown in FIG. 3D, etch back causes material loss 316d of the liner 306d to open the feature 302d and gain access to the void 310d formed from prior deposition by ALD of material 308d. The bottom of the feature 312d remains filled in the substrate 308d. However, such material loss 316d is undesirable.

FIGS. 4A-4D also show an example of undesirable etching caused by conventional dep-etch-dep processes for filling features with dielectric material. FIG. 4A includes a feature 402a in substrate 404a having sidewall topography formed by etching in liner 406a, the sidewall topography having stubs where the feature width at the stubs is narrower than at the bottom 412a of the feature. In such an embodiment, some stubs are at the same depth. In FIG. 4B, ALD is performed to deposit dielectric material 408b conformally into the feature 402b over liner 406b. Note the space 410b between deposited material on the sidewalls of the feature 402b remains open and the material 408b is deposited over stubs 416b, including the bottom 412b. However, to avoid formation of voids between sidewall topography, in FIG. 4C, the deposited dielectric material 408b is etched back to smoothen the deposited material, as depicted by the smoothened surface 414c of material 408c. Note that the feature 402c still includes rough deposited material near the stubs 416c and the bottom 412c of the feature 402c of substrate 404c. In FIG. 4D, the substrate 404 is further etched back to allow smoothening along the entire sidewall to reduce the formation of microvoids, as shown in the smoothening at the top of the feature 414d and the smoothening at the bottom of the feature 416d. Note that the dielectric material 408d at or near the stubs 416d and the bottom 412d of the feature are smoothened such that subsequent deposition by ALD will not form microvoids. However, such etch back resulted in material loss 416d of the liner 406d, which could thereby cause problems downstream.

FIGS. 5A-5C also show an example of a substrate having a multi-layer stack of two compositions 504a and 514a where the substrate includes features 502a with material 508a deposited over liner 506a conformally. In FIG. 5B, the material 508b is etched back to open the feature opening of features 502b, but such etching results in etching of liner 506b, thereby resulting in a tapered profile. In subsequent deposition of material 508c in FIG. 5C, the material deposits over the tapered profile, the result being a substrate with filled features but with material loss of the stack.

These and other issues with existing techniques result in undesired feature profiles for gapfill of high aspect ratio features and features with sidewall topography.

Provided herein are methods and apparatuses for depositing dielectric material into features having high aspect ratios, sidewall topography, multi-layer stack compositions, and re-entrant profiles. Methods include modulated dep-etch-dep durations and conditions to reduce and eliminate etching of a feature profile and underlayers of the substrate, including depositing a sacrificial helmet using plasma-enhanced chemical vapor deposition on the field surface of the substrate, thereby resulting in an overburden of material at the feature opening (which may be the same as or different from the material being deposited in the feature) and performing a longer etch back to open the feature while consuming only the sacrificial overburden of material without etching the underlying layers of the substrate and thus preventing etching of the feature profile.

While the description below focuses on dielectric feature fill, aspects of the disclosure may also be implemented in filling features with other materials. For example, feature fill using one or more techniques described herein may be used to fill features with other materials including silicon-containing materials (e.g., silicon carbide, silicon nitride, silicon oxide, silicon) and metal-containing materials (e.g., tungsten, ruthenium, copper, cobalt, molybdenum, nitrides and carbides thereof).

FIG. 6 is a process flow diagram depicting operations of a method performed in accordance with certain disclosed embodiments. Operations in FIG. 6 may be performed at a substrate temperature between about 50° C. and about 650° C.

In operation 602, a substrate is provided having features with sidewall topography. For example, the features may have a profile such as that depicted in FIG. 1E. Although the example described with respect to FIG. 6 is related to features with sidewall topography, it will be understood that in some embodiments, disclosed embodiments may be implemented on any one or more of high aspect ratio features with vertical sidewalls, features with re-entrant profiles, features with positively sloped sidewalls, features with negatively sloped sidewalls, and features with multi-stack compositions on the sidewalls such as depicted in FIGS. 1B, 1C, 1D, and 1A respectively. The substrate may be provided to a process chamber, which may be within a station of a single station or multi-station apparatus for processing one or more wafers.

In operation 604, a first amount of dielectric material is deposited in the features. In various embodiments, the first amount of dielectric material is insufficient to fill the feature. An insufficiently filled feature is defined as a feature having some dielectric material deposited therein and one or more voids present in the feature. Insufficiently filled features include features where material is deposited along the sidewalls of the feature but the feature opening remains open. Deposition during operation 604 may be performed at a chamber pressure between about 0.1 Torr and about 15 Torr, such as about 6 Torr.

In various embodiments, the dielectric material is silicon oxide. Silicon oxide may be deposited by ALD, plasma-enhanced ALD (PEALD), CVD, or plasma-enhanced CVD (PECVD). ALD is a technique that deposits thin layers of material using sequential self-limiting reactions. ALD processes use surface-mediated deposition reactions to deposit films on a layer-by-layer basis in cycles. As an example, an ALD cycle may include the following operations: (i) delivery/adsorption of a precursor, (ii) purging of the precursor from the chamber, (iii) delivery of a second reactant and optional plasma ignition, and (iv) purging of byproducts from the chamber. The reaction between the second reactant and the adsorbed precursor to form a film on the surface of a substrate affects the film composition and properties, such as nonuniformity, stress, wet etch rate, dry etch rate, electrical properties (e.g., breakdown voltage and leakage current), etc.

In one example of an ALD process, a substrate surface that includes a population of surface active sites is exposed to a gas phase distribution of a first precursor, such as a silicon-containing precursor, in a dose provided to a chamber housing the substrate. Molecules of this first precursor are adsorbed onto the substrate surface, including chemisorbed species and/or physisorbed molecules of the first precursor. It should be understood that when a compound is adsorbed onto the substrate surface as described herein, the adsorbed layer may include the compound as well as derivatives of the compound. For example, an adsorbed layer of a silicon-containing precursor may include the silicon-containing precursor as well as derivatives of the silicon-containing precursor. After a first precursor dose, the chamber is then evacuated to remove most or all of first precursor remaining in gas phase so that mostly or only the adsorbed species remain. In some implementations, the chamber may not be fully evacuated. For example, the reactor may be evacuated such that the partial pressure of the first precursor in gas phase is sufficiently low to mitigate a reaction. A second reactant, such as an oxygen-containing gas, is introduced to the chamber so that some of these molecules react with the first precursor adsorbed on the surface. In some processes, the second reactant reacts immediately with the adsorbed first precursor. In other embodiments, the second reactant reacts only after a source of activation such as plasma is applied temporally. The chamber may then be evacuated again to remove unbound second reactant molecules. As described above, in some embodiments the chamber may not be completely evacuated. Additional ALD cycles may be used to build film thickness.

In some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," which is herein incorporated by reference in its entirety.

For depositing silicon oxide, one or more silicon-containing precursors may be used. Silicon-containing precursors suitable for use in accordance with disclosed embodiments include polysilanes ($H_3Si$—$(SiH_2)_n$—$SiH_3$), where n≥0. Examples of silanes are silane ($SiH_4$), disilane ($Si_2H_6$), and organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like.

A halosilane includes at least one halogen group and may or may not include hydrogens and/or carbon groups. Examples of halosilanes are iodosilanes, bromosilanes, chlorosilanes, and fluorosilanes. Although halosilanes, particularly fluorosilanes, may form reactive halide species that can etch silicon materials when a plasma is struck, a halosilane may not be introduced to the chamber when a plasma is struck in some embodiments, so formation of a reactive halide species from a halosilane may be mitigated. Specific chlorosilanes are tetrachlorosilane, trichlorosilane, dichlorosilane, monochlorosilane, chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like.

An aminosilane includes at least one nitrogen atom bonded to a silicon atom, but may also contain hydrogens, oxygens, halogens, and carbons. Examples of aminosilanes are mono-, di-, tri- and tetra-aminosilane ($H_3Si(NH_2)$, $H_2Si(NH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tert-butylamino) silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like. A further example of an aminosilane is trisilylamine ($N(SiH_3)$).

Additional reactants are also used during operation 604. For deposition of a silicon oxide helmet by PECVD, an oxidant is flowed to the process chamber with the silicon-containing precursor to react and deposit silicon oxide on the substrate. Example oxidants include oxygen gas, water, carbon dioxide, nitrous oxide, and combinations thereof. In various embodiments, the substrate is exposed to an oxidant and an inert gas simultaneously while the plasma is ignited. For example, in one embodiment, a mixture of oxygen and argon is introduced to the substrate while the plasma is ignited. Example inert gases include helium and argon. In some embodiments, the inert gas acts as a carrier gas to deliver the process gases to the substrate and is diverted upstream of the chamber. For deposition by ALD or PEALD, the silicon-containing precursor and the reactant are introduced sequentially in pulses, which may be separated by purging operations. Such examples are further described below with respect to FIG. 7.

In embodiments where a combination of any of ALD, PEALD, CVD, and PECVD are used to deposit the dielectric material in operation 604, the same reactants and precursors may be used during both techniques. In some embodiments, different precursors may be selected depending on the technique. For example, in some embodiments, ALD may be performed using a halosilane, followed by PECVD using silane as the silicon-containing precursor. In some embodiments, a plasma is ignited during one or more of the techniques used to deposit the dielectric material.

In operation 607, a sacrificial helmet is deposited on a field surface of the substrate. A helmet is an overburden of material deposited preferentially on the field surface of the substrate relative to the interior of features on the substrate. In various embodiments, the helmet is a sacrificial material used to cushion subsequent etching processes so as to protect the underlying feature profile from being etched or damaged.

In various embodiments, the helmet material grows on dielectric material that was deposited in operation 604 that remained on the field surface of the substrate. Thus, the sacrificial helmet does not close over the feature opening and the feature opening remains open. In various embodiments, the sacrificial helmet is deposited by PECVD. The sacrificial helmet functions as a layer used to protect the underlying substrate and feature profile during subsequent etching operation 608. The sacrificial helmet may be the same or different material as the dielectric material deposited into the features. For example, in some embodiments, the sacrificial helmet is a silicon oxide material deposited by PECVD while the material to be deposited into the features is also silicon oxide.

In some embodiments, the helmet is deposited to a thickness between about 10 Å and about 500 Å. A helmet may be deposited using ALD, CVD, or a combination of both. In various embodiments, the helmet is deposited by PECVD. In various embodiments, the features are exposed to deposition precursors for depositing a helmet (such as a silicon-containing precursor and a nitrogen-containing precursor for depositing a silicon nitride helmet) for a duration sufficient to form the helmet. The duration depends on the size of the feature opening, the depth of the feature opening, the technique used to deposit the material, whether the material is the same as or different than the material deposited into the feature, and, if the material is the same as the material being deposited into the feature, the amount of material, if any, already deposited into the feature.

In some embodiments where the helmet material and the material being deposited into the feature are the same, the deposition of operation 604 may continue in cycles to deposit the sacrificial helmet for operation 607. In various embodiments, the deposition of operation 604 is performed by PEALD or ALD, while operation 607 is performed by PECVD. Where the materials of the helmet and material to be deposited into the features are the same, the same precursors may be used in both operation 604 and operation 607. For example, any of the precursors and reactants described above with respect to operation 604 may be used for depositing a silicon oxide helmet in operation 607.

In some embodiments, the sacrificial helmet is a different material as the material deposited into the features. For example, in some embodiments, the sacrificial helmet is a silicon nitride material deposited by PECVD while the material to be deposited into the features is silicon oxide. In various embodiments, the sacrificial helmet has etch selectivity to the material to be deposited when exposed to etchants used in operation 608, such that etching in operation 608 does not damage the sacrificial helmet and the helmet can therefore withstand many cycles of deposition and etch of the material to be deposited into the feature. In some embodiments, the helmet is a silicon nitride material deposited by PECVD or PEALD using a silicon precursor and nitrogen plasma, simultaneously or in alternating pulses respectively. In various embodiments, formation of a silicon nitride helmet is performed after silicon oxide is used to deposit the first amount of silicon oxide in the feature, and silicon nitride is deposited on the field surface of the substrate. In various embodiments, silicon nitride used as the helmet increases etch selectivity to the oxide during etching. For deposition by CVD, the substrate may be exposed to deposition precursors (such as a silicon-containing precursor and an oxidant for depositing silicon oxide) for a duration between about 2 seconds and about 120 seconds. In some embodiments, the helmet is deposited using a plasma-enhanced process, such as PEALD or PECVD.

For deposition of a silicon nitride helmet by PECVD, a nitrogen-containing gas such as nitrogen is flowed to the process chamber with a silicon-containing precursor to form silicon nitride. In various embodiments, nitrogen is ignited with a plasma to form silicon nitride.

In one example, silane is used as the silicon-precursor for performing PECVD of silicon nitride and/or silicon oxide. During deposition by PECVD, the precursor and reactants are flowed at various flow rates. For example, for depositing silicon oxide, silane may be flowed with nitrogen and/or nitrous oxide. Silane may be introduced at a flow rate between about 50 sccm and about 200 sccm, such as about 75 sccm. Nitrogen may be introduced at a flow rate between about 1000 sccm and about 15000 sccm, such as about 3000 sccm. Nitrous oxide may be introduced at a flow rate between about 5000 sccm and about 25000 sccm, such as about 20000 sccm.

In operation 608, the dielectric material is etched from feature openings to leave a partially etched dielectric material in the feature. Etching may be performed for a duration sufficient to widen the feature opening such that subsequent deposition is capable of reaching the bottom of the feature. For example, in some embodiments etching is performed for a duration between about 100 seconds and about 400 seconds, such as about 115 seconds, or about 200 seconds, or about 300 seconds, or about 400 seconds. In various embodiments, etching is performed for a duration sufficient to open the feature opening without removing material underlying the layers of the dielectric material deposited into the feature in operation 604. In various embodiments, etching is performed with etch selectivity to the helmet material. For example, in some embodiments, nitrogen trifluoride ($NF_3$) is the etchant used during operation 608 and the etch selectivity of silicon oxide to a sacrificial silicon nitride helmet is between about 3:1 and about 5:1.

In some embodiments where operation 604 involves deposition of an overburden or helmet, etching is performed such that the feature opening exposed while consuming some but not all of the helmet of sacrificial dielectric material on the field surface, thereby leaving a partially etched dielectric layer in the feature. Some of the helmet may be consumed even if the helmet is a different material than that of the material to be deposited. However, in some embodiments, a helmet of a different material having etch selectivity to the material being deposited into the feature allows for the helmet to withstand longer etching times without being consumed as quickly as a helmet of the same material as the material being deposited would be etched under the same process conditions. In some embodiments, a helmet of a different material having etch selectivity to the material being deposited into the feature allows a thinner helmet to be deposited while still mitigating etching of the feature profile.

The etchant selected depends on the material to be etched. For example, for etching silicon oxide, etching may be performed using a fluorine-containing etch chemistry, such as by flowing nitrogen trifluoride ($NF_3$). Example etchants for etching silicon oxide include nitrogen trifluoride, fluoroform ($CHF_3$), octafluorocyclobutane ($C_4F_8$), tetrafluoromethane (CF$_4$), and combinations thereof. Example etchants for etching silicon carbide, silicon nitride, silicon, tungsten, ruthenium, copper, cobalt, and molybdenum for feature fill using these materials include hydrobromic acid (HBr), fluoromethane (CH$_3$F), chlorine (Cl$_2$), silicon tetrafluoride (SiF$_4$), tetrafluoromethane (CF$_4$), boron trichloride (BCl), fluoroform (CHF$_3$) and combinations thereof.

In another example, for etching silicon carbide where silicon carbide is to be deposited into the features, etching may be performed using hydrobromic acid, or CH$_3$F.

In another example, for etching silicon nitride where silicon nitride is to be deposited into the features, etching may be performed using CH$_3$F.

In various embodiments, etchants may be flowed with one or more carrier gases, such as oxygen, nitrogen, and/or argon.

In various embodiments, a plasma is ignited during operation 608 to enhance etching. In some embodiments, the plasma is ignited using radio frequency plasma. In some embodiments, a self-bias bias may be applied to a powered pedestal holding the substrate during etch. In various embodiments, the plasma is ignited while flowing the nitrogen trifluoride gas using a plasma power between about 1000 W and about 5000 W. In various embodiments, the plasma is generated in-situ. In some embodiments, plasma may be generated remotely in a remote plasma chamber prior to delivering the process chamber housing the substrate.

In some embodiments, operations 604 and 608 are performed in different chambers. In some embodiments, operations 604 and 608 are performed in the same chamber. In some embodiments, operations 604 and 608 are performed without breaking vacuum. For example, in some embodiments operations 604 and 608 are performed in separate stations in a multi-station chamber without breaking vacuum. Disclosed embodiments promote efficiency since deposition and etching may be performed in the same chamber or in the same tool.

In some embodiments, operation 608 may be performed to smooth the sidewalls. Disclosed embodiments may also be suitable for smoothening sidewalls during deposition into features having sidewall topography such that etching performed between depositions of dielectric material is used to even out the surface and reduce the presence of stubs on the sidewalls of a feature. The etching may be performed by modulated the duration and plasma power to etch for a duration sufficient to smooth out the dielectric material deposited onto the sidewalls of the feature without exposing the underlying material on the substrate. Smoothening of sidewalls may be performed by etching for a duration of about 200 seconds or less than about 200 seconds, or for a duration shorter than which to open a feature opening.

In operation 610, a second amount of dielectric material is deposited over the partially etched dielectric material. In various embodiments, the second amount of dielectric material is deposited by ALD, PEALD, CVD, PECVD, or any combination thereof. Deposition may be performed using any suitable precursors and reactants. For example, for depositing a second amount of silicon oxide, any silicon-containing precursor described above with respect to operation 604 may be used for operation 610. Likewise, any suitable reactant for reacting with the precursor may be used. For example, for depositing silicon oxide, an oxidant such as oxygen or nitrous oxide may be used to react with the silicon-containing precursor. Any oxidant described above with respect to operation 604 may be used in operation 610.

In some embodiments, the process chamber is purged between operation 604 and operation 608. In some embodiments, the process chamber is purged between operation 608 and 610. In some embodiments, the process chamber is purged after operation 610. Purging the chamber may involve flowing a purge gas or a sweep gas, which may be a carrier gas used in other operations or may be a different gas. Example purge gases include argon, nitrogen, hydrogen, and helium. In various embodiments, the purge gas is an inert gas. Example inert gases include argon, nitrogen, and helium. In some embodiments, purging may involve evacuating the chamber. In some embodiments, purging may include one or more evacuation subphases for evacuating the process chamber. Alternatively, it will be appreciated that purging may be omitted in some embodiments. Purging may be performed for any suitable duration, such as between about 0.1 seconds and about 2 seconds.

In some embodiments, the second amount of the dielectric material fills the feature. In some embodiments, further operations are performed until the features are filled. For example, in some embodiments, operations 604, 608, and 610 are repeated in cycles. In some embodiments, after performing operation 604, operations 608 and 610 are repeated sequentially.

In some embodiments, operation 604 includes depositing a first amount of dielectric features by ALD and depositing a helmet by PECVD and etching in operation 608 is performed after deposition of the helmet. In some embodiments, the helmet is a different material than the dielectric used to fill the feature. For example, in some embodiments, silicon oxide is deposited in the features but silicon nitride is deposited as the helmet prior to etching. In some embodiments, using silicon nitride as the helmet where the material to be deposited into the feature is silicon oxide may be used to achieve high etch selectivity of the silicon nitride sacrificial helmet material relative to the silicon oxide material during etching to prevent removal of the material deposited in the feature. Additionally, use of a silicon nitride helmet may allow etching to be performed for a longer duration for less deposited silicon nitride, relative to using silicon oxide as a helmet. For example, for the same deposited thickness of a silicon nitride helmet versus a silicon oxide helmet, the silicon oxide helmet will etch faster than a silicon nitride helmet. Thus, a thicker silicon oxide helmet is used to achieve a specified etching duration used to open a feature where a thinner silicon nitride material is used.

Figure 7:
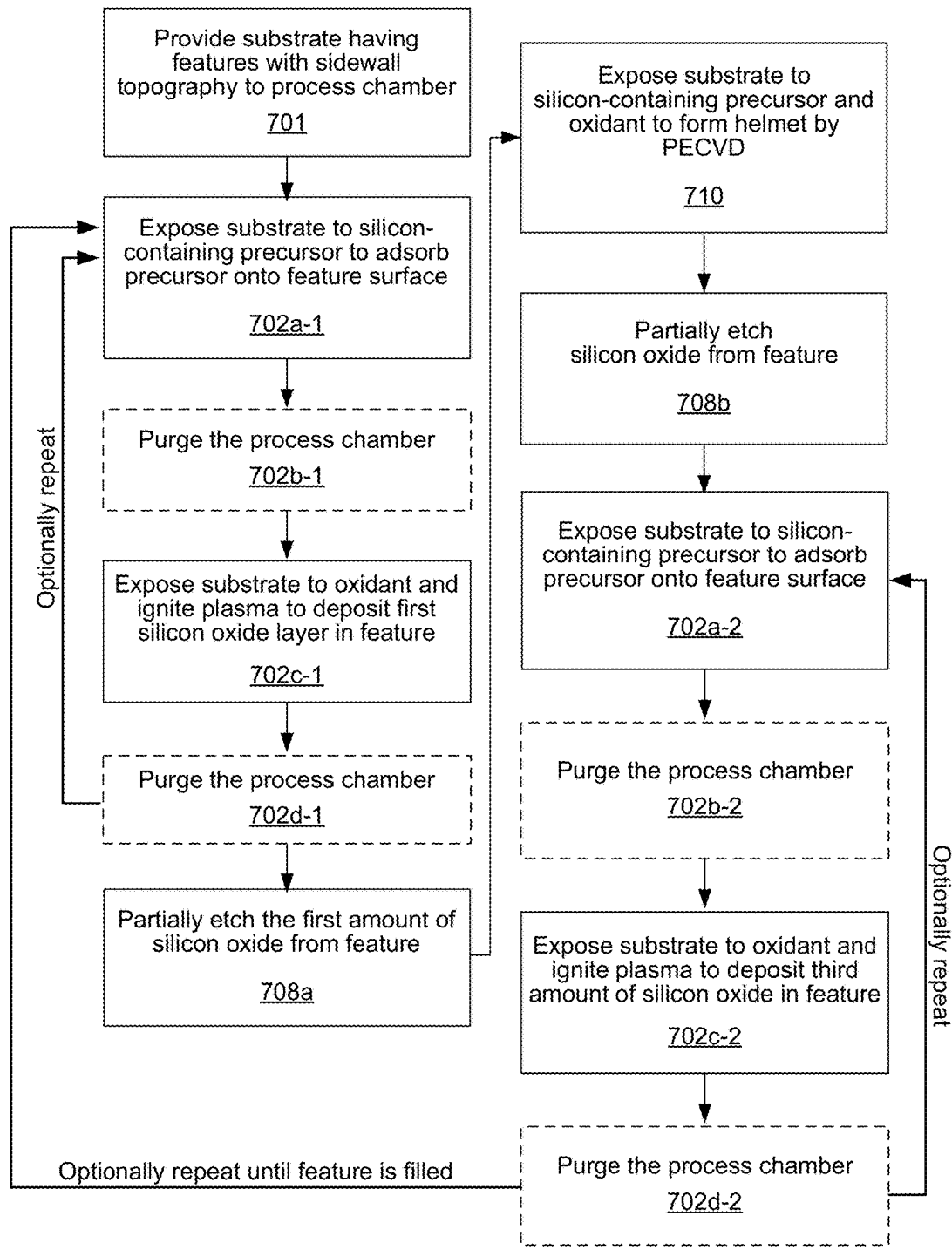

FIG. 7 provides an example process flow diagram of an example method performed in accordance with certain disclosed embodiments. The example process in FIG. 7 includes repetitions of various operations such as operations 604, 608, and 610 of FIG. 6.

In operation 701, a substrate having features with sidewall topography is provided to a process chamber. Although the example described herein refers to features having sidewall topography, it will be understood that such embodiments can apply to substrates having features in a multi-laminate stack, features with positively sloped sidewalls, features with negatively sloped sidewalls, and features with re-entrant profiles. Operation 701 may correspond to embodiments of operation 602 described above with respect to FIG. 6.

In operations 702a-1, 702b-1, 702c-1, and 702d-1, a first amount of dielectric material may be deposited into the features, and such operations may, in some embodiments, correspond to embodiments of operation 604 described above with respect to FIG. 6. In this specific example, operations 702a-1 through 702d-1 may constitute one ALD cycle. In operation 702a-1, the substrate is exposed to a silicon-containing precursor, such as any of those described above with respect to operation 604, to adsorb the precursor onto the surface of the feature. In various embodiments, this operation is self-limiting. In some embodiments, the precursor adsorbs to less than all of the active sites on the surface of the feature. In operation 702b-1, the process chamber is optionally purged to remove any unadsorbed silicon-containing precursors. In operation 702c-1, the substrate is exposed to an oxidant and a plasma is ignited to form a first silicon oxide layer in the feature. In various embodiments, this layer is the first amount of dielectric material deposited in features referred to above in operation 604 with respect to FIG. 6. In various embodiments, operation 702c-1 converts the adsorbed silicon-containing precursor layer to silicon oxide. In operation 702d-1, the process chamber is optionally purged to remove byproducts from the reaction between the silicon-containing precursor and the oxidant. Operations 702a-1 through 702d-1 may be optionally repeated for two or more cycles as desired to deposit silicon oxide to a desired thickness in the feature.

In operation 708a, the first amount of silicon oxide is partially etched from the feature. In various embodiments, this corresponds to operation 608 of FIG. 6. Operation 708a may be performed for a duration sufficient to open the feature opening. For example, in some embodiments, cycles of operations 702a-1 through 702d-1 may deposit silicon oxide into the feature until pinch-off, upon which operation 708a is performed to open the feature opening and thereby allow subsequent deposition. Any etching chemistry as described above with respect to operation 608 may be used. In some embodiments, a plasma is ignited to facilitate etching. It will be understood that the etching chemistry and the plasma conditions depend on the material being deposited in the features. For example, for deposition of silicon oxide, operation 708a may involve flowing nitrogen trifluoride and igniting a plasma at a power between about 1000 W and about 5000 W to etch silicon oxide.

In operation 710, the substrate is exposed to a silicon-containing precursor and an oxidant to form a second amount of silicon oxide by PECVD. This may correspond to operation 610 of FIG. 6 as described above. In some embodiments, the silicon-containing precursor used is the same as in operation 702a-1. In some embodiments, the silicon-containing precursor used is different from the silicon-containing precursor used in 702a-1. The selection of a silicon-containing precursor depends on the oxidant used and the technique (ALD, PEALD, CVD, PECVD, etc.) used. The oxidant may also be the same as or different from the oxidant used in operation 702c-1. The second amount of silicon oxide may be used to deposit a helmet on the field surface of the substrate.

In operation 708b, the silicon oxide may be etched from the feature opening. This may correspond to a repeated operation of operation 608 of FIG. 6 as described above. In some embodiments, the helmet deposited in operation 710 protects the material underlying the silicon oxide and the feature profile such that the helmet may be etched while etching the feature opening relative to the interior of the feature. For example, etching the feature opening may involve etching the top 5% or top 10% of the depth of the feature. In some embodiments, due to the high aspect ratio of the features, etching species may not reach the bottoms of the features and thus, only the top up to about 50% of the material deposited in the feature is etched. Such etching may be modulated by using a plasma power between about 1000 W and about 5000 W, for a duration between 2 seconds and about 200 seconds.

Operations 702a-2 through 702d-2 may constitute an ALD cycle. Such example shows the repeating of, for example, operation 604 of FIG. 6. Operation 702a-2 may be the same as or involve the same precursors and conditions as operation 702a-1, operation 702b-2 may be the same as or involve the same purging conditions as operation 702b-1, operation 702c-2 may be the same as or involve the same oxidant and/or plasma conditions as operation 702c-1, and operation 702d-2 may be the same as or involve the same purging conditions as operation 702d-1. During operation 702a-2, the substrate is exposed to a silicon-containing precursor to adsorb the precursor to the feature surface, which includes silicon oxide previously deposited and/or etched in prior operations. In some embodiments, operations 702a-1, 702b-1, 702c-1, 702d-1, 708a, 710, 708b, 702a-2, 702b-2, 702c-2, and 702d-2 may be optionally repeated until the features are filled.

FIGS. 8A-8D show an example of a substrate 804a having a feature 802a with a re-entrant feature defined by liner 806a and a bottom of the feature 812a undergoing feature fill operations in accordance with certain disclosed embodiments. In FIG. 8B, a first amount of silicon oxide 808b is deposited over the substrate to form a helmet. While silicon oxide is depicted as an example, in some embodiments, the helmet is silicon nitride, or silicon oxynitride. Due to the re-entrant profile, a void 810b is formed. This may correspond to deposition in operation 604 of FIG. 6. In FIG. 8C, the substrate is etched back as shown in the etched silicon oxide 808c. This may correspond to operation 608 of FIG. 6. In FIG. 8D, the substrate etch back is complete and the feature is opened as shown with the exposed void 810d, with no material loss 816d given the sacrificial helmet that was consumed during etch back. The feature 802d may now be filled with subsequent ALD operations to deposit silicon oxide without having a void, as compared to FIG. 3D.

FIGS. 9A-9D show an example of a substrate 904a having a feature 902a with a feature profile defined by liner 906a with stubs 916a and a bottom of the feature 912a undergoing feature fill operations in accordance with certain disclosed embodiments. In FIG. 9B, a first amount of silicon oxide 908b is deposited over the substrate to form a helmet as shown in the overburden deposited over the field surface of the liner 906b. Due to the sidewall topography, there is space 910b between the sidewalls of deposited silicon oxide. This deposition may correspond to deposition in operation 604 of FIG. 6. In FIG. 9C, the substrate is etched back as shown in the etched silicon oxide 908c, resulting in smoothened surface 914c. This may correspond to operation 608 of FIG. 6. In FIG. 9D, the substrate etch back is complete and the feature is opened and the sidewalls at 914d and 916d are both smoothened as shown, with no material loss 916d given the sacrificial helmet that was consumed during etch back. The feature 902d may now be filled with subsequent ALD operations to deposit silicon oxide without having a void, as compared to FIG. 4D.

FIGS. 9E-9H show an example of a substrate 904e having a feature 902e with a feature profile defined by liner 906e with stubs 916e and a bottom of the feature 912e undergoing feature fill operations in accordance with certain disclosed embodiments. In FIG. 9F, a first amount of silicon oxide 908f is deposited into the feature 902f, and a silicon nitride helmet 999f is deposited over the substrate as shown in the overburden deposited over the field surface of the liner 906f. This deposition may correspond to deposition in operations 604 and 607 of FIG. 6. Due to the sidewall topography, there is space 910f between the sidewalls of deposited silicon oxide. In FIG. 9G, the substrate is etched back as shown in the etched silicon oxide 908g, resulting in smoothened surface 914g. This may correspond to operation 608 of FIG. 6. Note that silicon nitride has etch selectivity to silicon oxide, so much of the silicon oxide remains and the silicon nitride helmet can withstand the etching operation for a longer duration; however since etch selectivity here is not necessarily infinite, some silicon nitride may be removed during the etching process. In FIG. 9H, the substrate etch back is complete and the feature is opened and the sidewalls at 914h and 916h are both smoothened as shown, with no material loss 916h given the sacrificial helmet 999h having etch selectivity relative to silicon oxide. Note that in some embodiments, some of the helmet 999h may be removed but not as much as silicon oxide would, given the same etching conditions. The feature 902h may now be filled with subsequent ALD operations to deposit silicon oxide without having a void, as compared to FIG. 4D.

FIGS. 10A-10C show an example of a substrate with multi-laminate stack having two materials 1004a and 1014a with having a feature 1002a undergoing feature fill operations in accordance with certain disclosed embodiments. A first amount of silicon oxide 1008a is deposited over the substrate to form a helmet. This may correspond to deposition in operation 604 of FIG. 6. In FIG. 10B, the substrate is etched back as shown in the etched silicon oxide 1008b. This may correspond to operation 608 of FIG. 6. In FIG. 10C, the feature 1002c is filled with subsequent ALD operations to deposit silicon oxide without causing damage to the feature profile, as compared to FIG. 5C.

Figure 11:
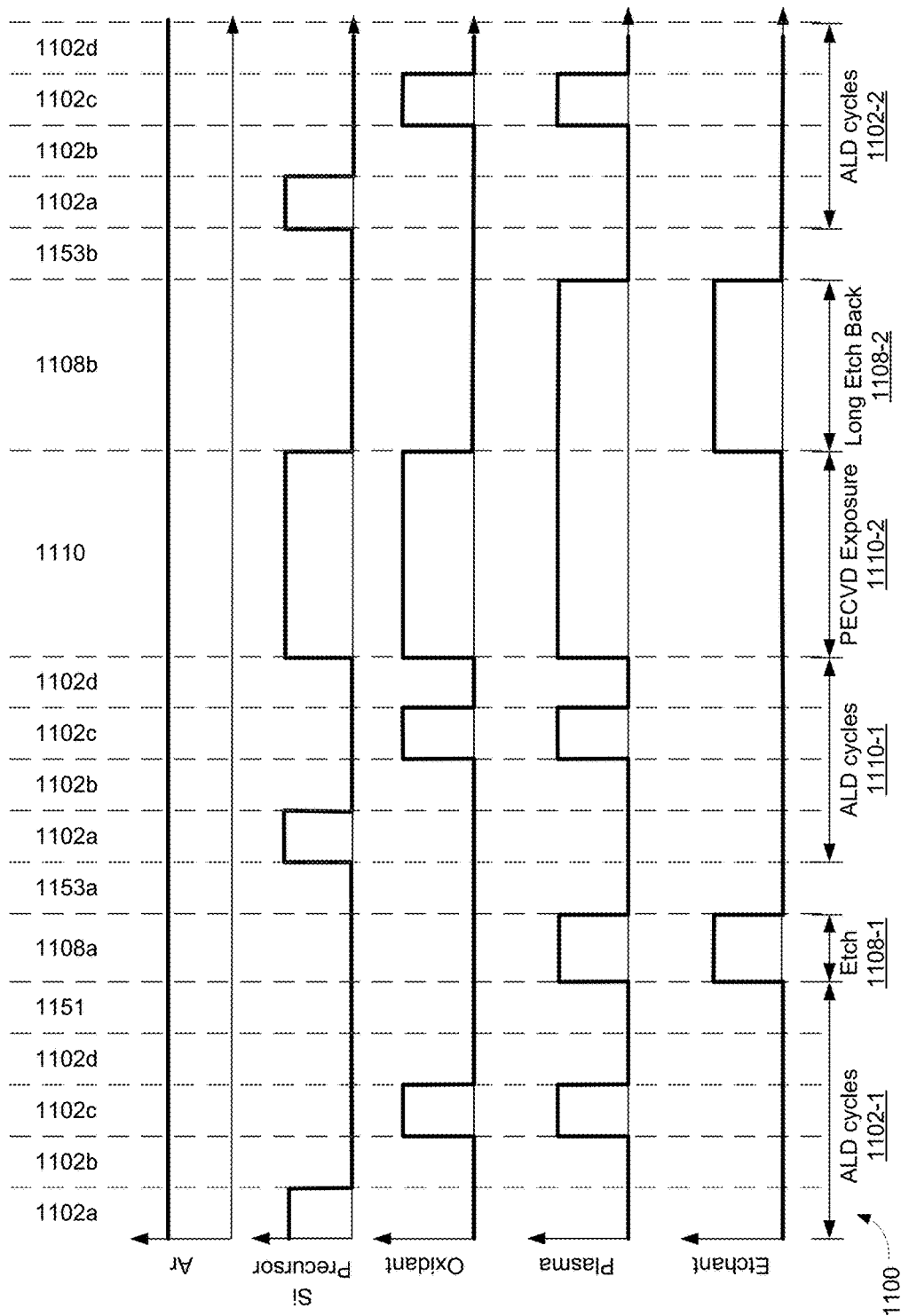
FIG. 11 is a timing schematic diagram depicting an example of operations performed in accordance with certain disclosed embodiments.

FIG. 11 is a timing sequence diagram of example pulses in accordance with an example of repeated operations of FIG. 6 using a combination of PEALD and PECVD for depositing silicon oxide during deposition operations. FIG. 11 shows phases in an example process 1100, for various process parameters, such as carrier gas or purge gas flow, silicon-containing precursor flow, oxidant flow, plasma power, and etchant flow. The lines indicate when the flow or plasma power is turned on and off. Other process parameters not shown in FIG. 11 may also be relevant for modulating certain disclosed embodiments; such parameters include, but are not limited to, flow rates for precursor, inert, reactant, and etchant gases, substrate temperature, and process chamber pressure.

Process 1100 includes ALD cycles 1102-1, etch phase 1108-1, ALD cycle 1110-1, PECVD exposure phase 1110-2, long etch back phase 1108-2, and ALD cycles 1102-2. Although a specific sequence of example operations are shown in FIG. 11, it will be understood that this is an example and other variations of ALD, PECVD, and etching may be used for substrates with features of various types and for various materials. Further, while FIG. 11 shows silicon precursor and oxidant flows for depositing silicon oxide, it will be understood that embodiments may be suitable for depositing any desired material such as described elsewhere herein.

ALD cycles 1102-1 include silicon-containing precursor exposure phase 1102a, purge phase 1102b, oxidant exposure phase 1102c, and purge phase 1102d. In silicon-containing precursor exposure phase 1102a, argon is flowed as a carrier gas with silicon-containing precursor gas flow on, while oxidant and etchant flows are off and the plasma is turned off. In purge phase 1102b, argon gas remains on while silicon-containing gas, oxidant gas, and etchant gas flows are off and plasma is off. In oxidant exposure phase 1102c, oxidant and purge gas flows are on, while plasma is turned on and silicon-containing precursor and etchant gas flows are off. In purge phase 1102d, argon gas is on while silicon-containing gas flow, oxidant gas flow, and etchant gas flows are off and plasma is turned off. While one ALD cycle is depicted, it will be understood that multiple cycles may be performed in some embodiments.

Etch phase 1108-1 includes one etching phase 1108a whereby argon gas and etchant gas flows are on and plasma is turned on, while silicon-containing precursor and oxidant gas flows are off.

In purge phase 1153a, argon acts as a purge gas and argon gas flow is turned on, while silicon-containing precursor gas, oxidant gas, and etchant gas flows are off and the plasma is turned off.

ALD cycles 1110-1 are performed to deposit more silicon oxide material after etching in etch phase 1108-1. ALD cycles 1110-1 include repeating operations from ALD cycles 1102-1 such that ALD cycles 1110-1 includes silicon-containing precursor exposure phase 1102a, purge phase 1102b, oxidant exposure phase 1102c, and purge phase 1102d. In silicon-containing precursor exposure phase 1102a, argon is flowed as a carrier gas with silicon-containing precursor gas flow on, while oxidant and etchant flows are off and the plasma is turned off. In purge phase 1102b, argon gas remains on while silicon-containing gas, oxidant gas, and etchant gas flows are off and plasma is off. In oxidant exposure phase 1102c, oxidant and purge gas flows are on, while plasma is turned on and silicon-containing precursor and etchant gas flows are off. In purge phase 1102d, argon gas is on while silicon-containing gas flow, oxidant gas flow, and etchant gas flows are off and plasma is turned off. While one ALD cycle is depicted, it will be understood that multiple cycles may be performed in some embodiments.

In this example, a combination of ALD cycles 1110-1 and PECVD exposure 1110-2 are performed to deposit a second amount of silicon oxide after etching in etch phase 1108-1. During PECVD exposure phase 1110-2, only one operation of PECVD exposure 1110 is depicted, whereby argon is flowed, silicon-containing precursor gas is flowed, oxidant gas is flowed, and a plasma is ignited to deposit silicon oxide. It will be understood that the silicon-containing precursor may be the same as or different from the silicon-containing precursor used in ALD cycles 1102-1 and 1110-1. PECVD exposure 1110-2 may correspond to formation of a helmet on a field surface of a substrate.

In long etch back phase 1108-2, a longer duration of etching 1108b is depicted whereby argon is flowed, etchant gas is flowed, and plasma is ignited to facilitate etching, while silicon-containing precursor and oxidant gas flows are turned off. This may correspond to opening of a feature opening by etching after forming a sacrificial helmet on the substrate.

Purge phase 1153b involves flowing argon gas, while silicon-containing gas, oxidant gas, and etchant gas flows are turned off and plasma is off. ALD cycles 1102-2 include repeating operations from ALD cycles 1102-1 such that ALD cycles 1101-2 includes silicon-containing precursor exposure phase 1102a, purge phase 1102b, oxidant exposure phase 1102c, and purge phase 1102d. In silicon-containing precursor exposure phase 1102a, argon is flowed as a carrier gas with silicon-containing precursor gas flow on, while oxidant and etchant flows are off and the plasma is turned off. In purge phase 1102b, argon gas remains on while silicon-containing gas, oxidant gas, and etchant gas flows are off and plasma is off. In oxidant exposure phase 1102c, oxidant and purge gas flows are on, while plasma is turned on and silicon-containing precursor and etchant gas flows are off. In purge phase 1102d, argon gas is on while silicon-containing gas flow, oxidant gas flow, and etchant gas flows are off and plasma is turned off. While one ALD cycle is depicted, it will be understood that multiple cycles may be performed in some embodiments.

Apparatus

Figure 12:
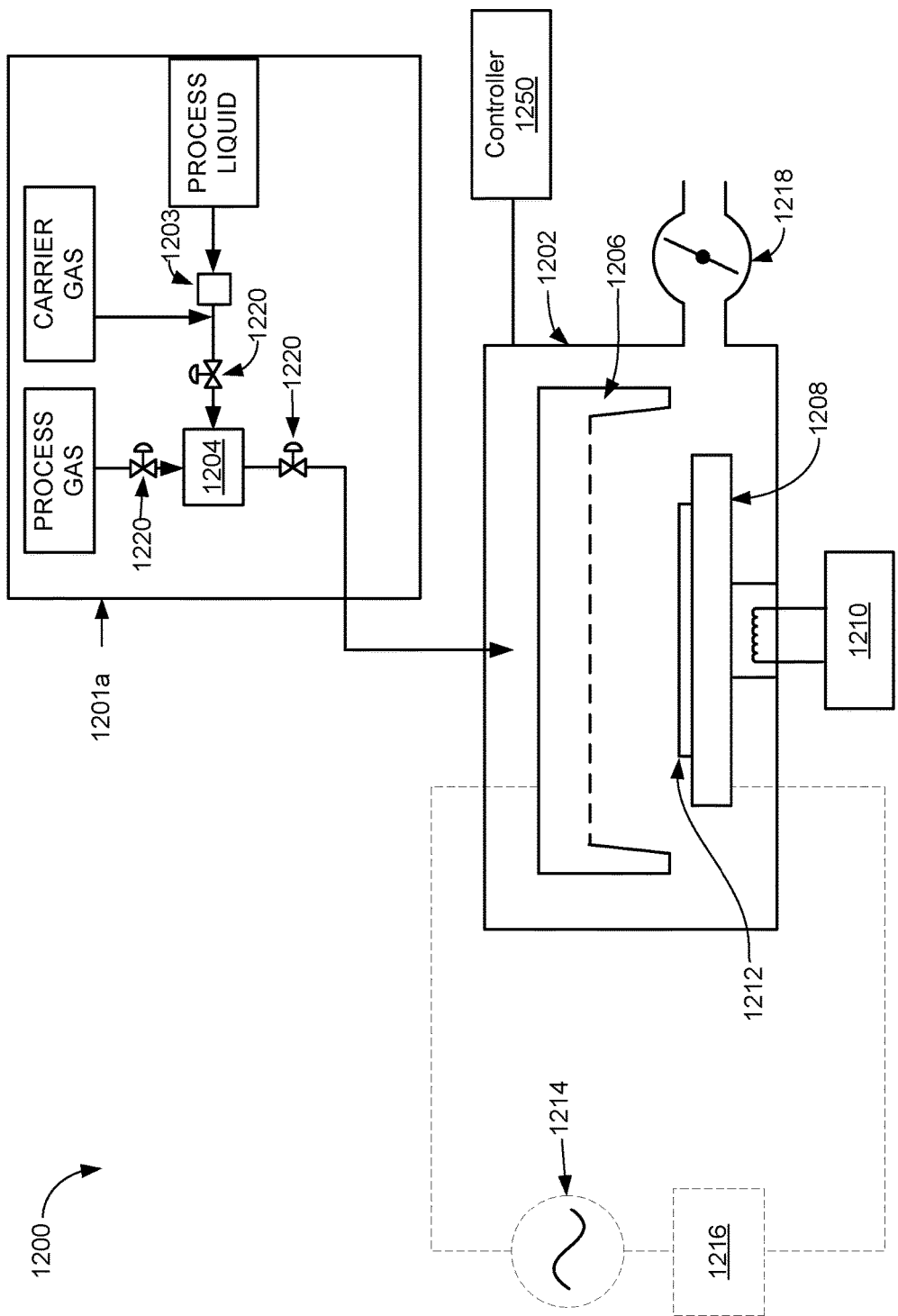
FIG. 12 is a schematic diagram of an example process chamber for performing certain disclosed embodiments.
Figure 13:
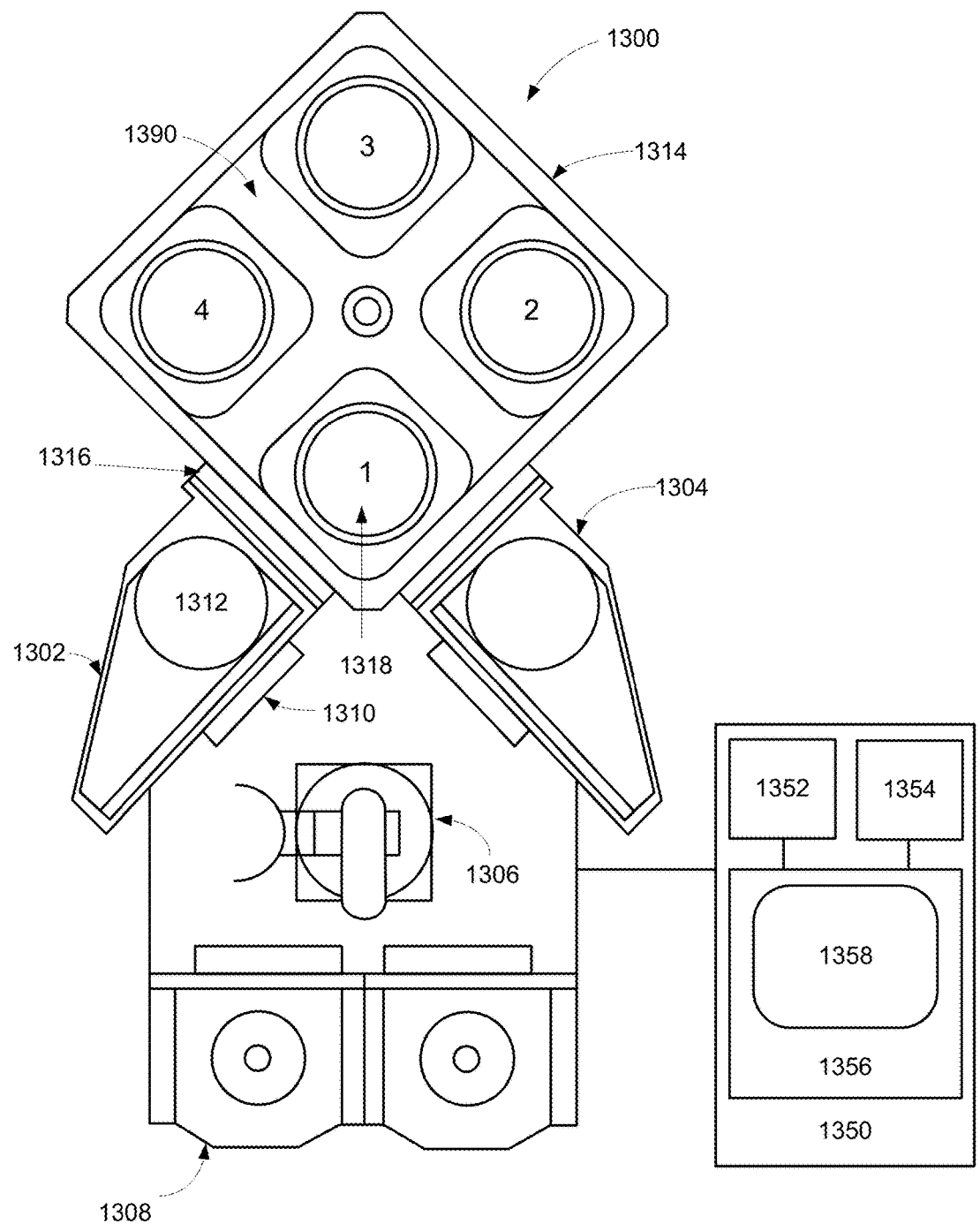
FIG. 13 is a schematic diagram of an example process tool for performing certain disclosed embodiments.

FIG. 12 depicts a schematic illustration of an embodiment of an atomic layer deposition (ALD) process station 1200 having a process chamber body 1202 for maintaining a low-pressure environment. Such station may be used for performing certain disclosed embodiments, including deposition by ALD, PEALD, CVD, PECVD, as well as etch back operations. A plurality of ALD process stations 1200 may be included in a common low pressure process tool environment. For example, FIG. 13 depicts an embodiment of a multi-station processing tool 1300. In some embodiments, one or more hardware parameters of ALD process station 1200 including those discussed in detail below may be adjusted programmatically by one or more computer controllers 1250.

ALD process station 1200 fluidly communicates with reactant delivery system 1201a for delivering process gases to a distribution showerhead 1206. Reactant delivery system 1201a includes a mixing vessel 1204 for blending and/or conditioning process gases, such as an silicon-containing precursor gas, or oxidant gas (e.g., oxygen or nitrous oxide), inert gases, etchant gases (e.g., nitrogen trifluoride) for delivery to showerhead 1206. One or more mixing vessel inlet valves 1220 may control introduction of process gases to mixing vessel 1204. Nitrogen trifluoride and/or oxidant plasma may also be delivered to the showerhead 1206 or may be generated in the ALD process station 1200.

As an example, the embodiment of FIG. 12 includes a vaporization point 1203 for vaporizing liquid reactant to be supplied to the mixing vessel 1204. In some embodiments, vaporization point 1203 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 1203 may be heat traced. In some examples, mixing vessel 1204 may also be heat traced. In one non-limiting example, piping downstream of vaporization point 1203 has an increasing temperature profile extending from approximately 100° C. to approximately 150° C. at mixing vessel 1204.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1203. In one scenario, a liquid injector may be mounted directly to mixing vessel 1204. In another scenario, a liquid injector may be mounted directly to showerhead 1206.

In some embodiments, a liquid flow controller (LFC) upstream of vaporization point 1203 may be provided for controlling a mass flow of liquid for vaporization and delivery to process station 1200. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 1206 distributes process gases toward substrate 1212. In the embodiment shown in FIG. 12, the substrate 1212 is located beneath showerhead 1206 and is shown resting on a pedestal 1208. Showerhead 1206 may have any suitable shape, and may have any suitable number and arrangement of ports for distributing process gases to substrate 1212.

In some embodiments, pedestal 1208 may be raised or lowered to expose substrate 1212 to a volume between the substrate 1212 and the showerhead 1206. It will be appreciated that, in some embodiments, pedestal height may be adjusted programmatically by a suitable computer controller 1250. In some embodiments, the pedestal is powered and power may be applied to generate a bias to the pedestal.

In another scenario, adjusting a height of pedestal 1208 may allow a plasma density to be varied during plasma activation cycles in the process in embodiments where a plasma is ignited. At the conclusion of the process phase, pedestal 1208 may be lowered during another substrate transfer phase to allow removal of substrate 1212 from pedestal 1208.

In some embodiments, pedestal 1208 may be temperature controlled via heater 1210. In some embodiments, the pedestal 1208 may be heated to a temperature of between about 50° C. and about 650° C. In some embodiments, the pedestal is set at a temperature between about 50° C. and about 500° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 1200 may be provided by butterfly valve 1218. As shown in the embodiment of FIG. 12, butterfly valve 1218 throttles a vacuum provided by a downstream vacuum pump (not shown). However, in some embodiments, pressure control of process station 1200 may also be adjusted by varying a flow rate of one or more gases introduced to the process station 1200.

In some embodiments, a position of showerhead 1206 may be adjusted relative to pedestal 1208 to vary a volume between the substrate 1212 and the showerhead 1206. Further, it will be appreciated that a vertical position of pedestal 1208 and/or showerhead 1206 may be varied by any suitable mechanism within the scope of the present disclosure. In some embodiments, pedestal 1208 may include a rotational axis for rotating an orientation of substrate 1212. It will be appreciated that, in some embodiments, one or more of these example adjustments may be performed programmatically by one or more suitable computer controllers 1250.

In some embodiments where plasma may be used as discussed above, showerhead 1206 and pedestal 1208 electrically communicate with a radio frequency (RF) power supply 1214 and matching network 1216 for powering a plasma. In some embodiments, the plasma energy may be controlled by controlling one or more of a process station pressure, a gas concentration, an RF source power, an RF source frequency, and a plasma power pulse timing. For example, RF power supply 1214 and matching network 1216 may be operated at any suitable power to form a plasma having a desired composition of radical species. Examples of suitable powers are included above. Likewise, RF power supply 1214 may provide RF power of any suitable frequency. In some embodiments, RF power supply 1214 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 40 MHz, or greater than 60 MHz. It will be appreciated that any suitable parameters may be modulated discretely or continuously to provide plasma energy for the surface reactions. Plasma power may vary depending on whether the station is performing deposition or etching. For example, example etching plasma powers include 1000 W to 5000 W.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1250 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon-containing precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as oxygen, instructions for modulating the flow rate of a carrier or purge gas, and time delay instructions for the third recipe phase. A fourth, subsequent recipe phase may include instructions for modulating or stopping a flow rate of an etchant gas, and instructions for modulating a flow rate of a carrier or purge gas and time delay instructions for the fourth recipe phase. A fifth recipe phase may include instructions for modulating a flow rate of a silicon-containing gas as well as a nitrogen-containing or oxygen-containing gas for depositing a silicon nitride or oxide helmet respectively, instructions for modulating the flow rate of a carrier or purge gas, and time delay instructions for the fifth recipe phase. It will be appreciated that these recipe phases may be further subdivided and/or iterated in any suitable way within the scope of the disclosed embodiments. In some embodiments, the controller 1250 may include any of the features described below with respect to system controller 1350 of FIG. 13.

As described above, one or more process stations may be included in a multi-station processing tool. FIG. 13 shows a schematic view of an embodiment of a multi-station processing tool 1300 with an inbound load lock 1302 and an outbound load lock 1304, either or both of which may include a remote plasma source. A robot 1306 at atmospheric pressure is configured to move wafers from a cassette loaded through a pod 1308 into inbound load lock 1302 via an atmospheric port 1310. A wafer is placed by the robot 1306 on a pedestal 1312 in the inbound load lock 1302, the atmospheric port 1310 is closed, and the load lock is pumped down. Where the inbound load lock 1302 includes a remote plasma source, the wafer may be exposed to a remote plasma treatment in the load lock prior to being introduced into a processing chamber 1314. Further, the wafer also may be heated in the inbound load lock 1302 as well, for example, to remove moisture and adsorbed gases. Next, a chamber transport port 1316 to processing chamber 1314 is opened, and another robot (not shown) places the wafer into the reactor on a pedestal of a first station shown in the reactor for processing. While the embodiment depicted in FIG. 13 includes load locks, it will be appreciated that, in some embodiments, direct entry of a wafer into a process station may be provided.

The depicted processing chamber 1314 includes four process stations, numbered from 1 to 4 in the embodiment shown in FIG. 13. Each station has a heated pedestal (shown at 1318 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 1314 may include one or more matched pairs of ALD and plasma-enhanced ALD process stations. While the depicted processing chamber 1314 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 13 depicts an embodiment of a wafer handling system 1390 for transferring wafers within processing chamber 1314. In some embodiments, wafer handling system 1390 may transfer wafers between various process stations and/or between a process station and a load lock. It will be appreciated that any suitable wafer handling system may be employed. Non-limiting examples include wafer carousels and wafer handling robots. FIG. 13 also depicts an embodiment of a system controller 1350 employed to control process conditions and hardware states of process tool 1300. System controller 1350 may include one or more memory devices 1356, one or more mass storage devices 1354, and one or more processors 1352. Processor 1352 may include a CPU or computer, analog, and/or digital input/output connections, stepper motor controller boards, etc.

In some embodiments, system controller 1350 controls all of the activities of process tool 1300. System controller 1350 executes system control software 1358 stored in mass storage device 1354, loaded into memory device 1356, and executed on processor 1352. Alternatively, the control logic may be hard coded in the controller 1350. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1358 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1300. System control software 1358 may be configured in any suitable way. For example, various process tool component subroutines or control objects may be written to control operation of the process tool components used to carry out various process tool processes. System control software 1358 may be coded in any suitable computer readable programming language.

In some embodiments, system control software 1358 may include input/output control (IOC) sequencing instructions for controlling the various parameters described above. Other computer software and/or programs stored on mass storage device 1354 and/or memory device 1356 associated with system controller 1350 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1318 and to control the spacing between the substrate and other parts of process tool 1300.

A process gas control program may include code for controlling gas composition (e.g., silicon-containing gases, oxidant gases, etchant gases, carrier gases, and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1350. The user interface may include a display screen, graphical software displays of the apparatus and/or process conditions, and user input devices such as pointing devices, keyboards, touch screens, microphones, etc.

In some embodiments, parameters adjusted by system controller 1350 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1350 from various process tool sensors. The signals for controlling the process may be output on the analog and digital output connections of process tool 1300. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1350 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 1350 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1350.

In some implementations, the system controller 1350 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1350, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1350 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1350 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1350, in some implementations, may be a part of or coupled to a computer that is integrated with, coupled to the system, otherwise networked to the system, or a combination thereof. For example, the system controller 1350 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1350 receives instructions in the form of data, which specify parameters for each of the processing steps to be performed during one or more operations. It should be understood that the parameters may be specific to the type of process to be performed and the type of tool that the system controller 1350 is configured to interface with or control. Thus as described above, the system controller 1350 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 1350 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

EXPERIMENTAL

Experiment 1

An experiment was conducted on a substrate with a 15:1 feature having a depth of 5 microns with recessed tungsten and silicon oxide stubs and re-entrancy at the top of the feature near the feature opening. Conventional atomic layer deposition of silicon oxide over such a substrate performed on the substrate, which resulted in voids where the oxide stubs come together on the sidewalls. Re-entrancy at the top of the feature also resulted in top voids. Another similar substrate was exposed to 300 cycles of ALD, etch back using $NF_3$, multiple cycles of ALD, deposition of a helmet using PECVD for 60 seconds, a long etch back, and ALD deposition to fill the features. The substrate resulted in no voids, and no removal of material from the corners at the feature opening. These results suggested viability of certain disclosed dep-etch-dep operations used for void-free gapfill of dielectric material in high aspect ratio features with sidewall topography.

Experiment 2

An experiment was conducted on a substrate with recessed features having a depth of 160 nm where the surface of the recessed features was silicon nitride where the feature opening at the top of the feature is 25 nm and the sidewalls narrow depth wise to the bottom of the feature. Silicon oxide was deposited into the features using 40 cycles of ALD using an aminosilane precursor and $N_2O/O_2$ with plasma. Following ALD, a silicon oxide helmet was deposited by PECVD to a thickness of 125 Å. After helmet deposition, the substrate was etched using $NF_3$ for a duration of 32 seconds. The helmet was consumed entirely during the etch. Subsequent ALD was performed to complete fill of the features. The feature was filled with little to no void formation.

An experiment was conducted on a substrate with recessed features having a depth of 160 nm where the surface of the recessed features was silicon nitride where the feature opening at the top of the feature is 25 nm and the sidewalls narrow depth wise to the bottom of the feature. Silicon oxide was deposited into the features using 40 cycles of ALD using an aminosilane precursor and $N_2O/O_2$ with plasma. Following ALD, a silicon nitride helmet was deposited by PECVD using an aminosilane precursor and a nitrogen plasma to a thickness of 125 Å. After helmet deposition, the substrate was etched using $NF_3$ for a duration of 32 seconds. Greater than 50% of the helmet remained after etch. Subsequent ALD was performed to complete fill of the features. Etch selectivity of the silicon nitride helmet to the silicon oxide deposited by ALD allowed for longer etch duration to open the feature.

An experiment was conducted on a substrate with recessed features having a depth of 160 nm where the surface of the recessed features was silicon nitride where the feature opening at the top of the feature is 25 nm and the sidewalls narrow depth wise to the bottom of the feature. Silicon oxide was deposited into the features using 40 cycles of ALD using an aminosilane precursor and $N_2O/O_2$ with plasma. Following ALD, a silicon nitride helmet was deposited by PECVD using an aminosilane precursor and a nitrogen plasma to a thickness of 65 Å. After helmet deposition, the substrate was etched using $NF_3$ for a duration of 32 seconds. The helmet was consumed entirely during the etch. Subsequent ALD was performed to complete fill of the features. Due to the etch selectivity of the silicon nitride helmet to the silicon oxide deposited by ALD, a thinner helmet was able to be used and still achieve void-free feature fill.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of filling a feature on a substrate, the method comprising:
   providing the substrate comprising the feature to a process chamber, the feature comprising a feature opening and sidewalls, the sidewalls having sidewall topography comprising stubs on a surface of the sidewall and regions between the stubs;
   depositing a first amount of silicon oxide into the feature conformally over the sidewall topography for a duration insufficient to fill the feature using a silicon-containing precursor and an oxidant to form the first amount of the silicon oxide having the sidewall topography;
   exposing the first amount of the silicon oxide to an etchant to etch some of the first amount of the silicon oxide to smoothen the sidewall topography of the first amount of the silicon oxide and form an etched first amount of the silicon oxide; and
   after etching the first amount of the silicon oxide, depositing a second amount of the silicon oxide over the etched first amount of the silicon oxide.

2. The method of claim 1, wherein the stubs of the surface prior to depositing the first amount of silicon oxide have a dimension perpendicular to a planar surface of the sidewall of between 20 Å and about 300 Å.

3. The method of claim 1, wherein the duration insufficient to deposit the first amount of the silicon oxide into the feature forms an overburden of silicon oxide on a field surface of the substrate.

4. The method of claim 3, wherein exposing the first amount of the silicon oxide to the etchant comprises preferentially etching the some of the first amount of the silicon oxide at or near regions between the stubs at the feature opening relative to inside the feature.

5. The method of claim 1, wherein the second amount of the silicon oxide is deposited by plasma-enhanced chemical vapor deposition.

6. The method of claim 5, further comprising after depositing the second amount of the silicon oxide, exposing the second amount of the silicon oxide to the etchant for a duration longer than the duration used for exposing the first amount of the silicon oxide to the etchant.

7. The method of claim 1, wherein the sidewalls of the feature comprise two or more materials layered in a stack.

8. The method of claim 1, wherein the depositing of the first amount of the silicon oxide and the exposing of the first amount of the silicon oxide to the etchant are performed without breaking vacuum.

9. The method of claim 1, wherein the exposing of the first amount of the silicon oxide to the etchant and the depositing of the second amount of the silicon oxide are performed without breaking vacuum.

10. The method of claim 1, wherein the first amount of the silicon oxide is deposited by one or more cycles of atomic layer deposition, each cycle of atomic layer deposition comprising alternating pulses of the oxidant and the silicon-containing precursor.

11. The method of claim 10, wherein a plasma is ignited during pulses of the oxidant.

12. The method of claim 1, wherein the etchant is selected from the group consisting of nitrogen trifluoride, fluoroform (CHF3), octafluorocyclobutane (C4F8), tetrafluoromethane (CF4), and combinations thereof.

13. The method of claim 1, wherein the feature has a depth of between about 0.5 microns and 6 microns.

14. The method of claim 1, wherein the feature has an aspect ratio of at least 6:1.

15. A method of filling a feature on a substrate, the method comprising:
   providing the substrate comprising the feature to a process chamber, the feature comprising a feature opening and sidewalls, the sidewalls having sidewall topography comprising stubs on a surface of the sidewall and regions between the stubs;
   depositing a first amount of silicon oxide into the feature conformally over the sidewall topography for a duration insufficient to fill the feature using a silicon-containing precursor and an oxidant to form the first amount of the silicon oxide having the sidewall topography;
   after depositing the first amount of silicon oxide and prior to exposing the first amount of silicon oxide to an etchant, depositing a sacrificial helmet forming an overburden on a field surface of the substrate;
   exposing the substrate to the etchant to etch some of the first amount of the silicon oxide to smoothen the sidewall topography of the first amount of the silicon oxide and form an etched first amount of the silicon oxide; and after etching the first amount of the silicon oxide, depositing a second amount of the oxide over the etched first amount of the silicon oxide to at least partially fill the feature.

16. The method of claim 15, wherein sacrificial helmet is deposited by plasma enhanced chemical vapor deposition.

17. The method of claim 15, wherein the sacrificial helmet comprises silicon nitride or silicon oxide.

18. The method of claim 15, wherein the sacrificial helmet comprises material different from the silicon oxide deposited in the feature.

19. The method of claim 5, further comprising after depositing the second amount of the silicon oxide, exposing the second amount of the silicon oxide to the etchant for a duration shorter than the duration used for exposing the first amount of the silicon oxide to the etchant.

20. The method of claim 14, wherein the feature has an aspect ratio of at least 15:1.

* * * * *